(12) United States Patent
Wong et al.

(10) Patent No.: US 12,181,309 B2
(45) Date of Patent: Dec. 31, 2024

(54) LASER LEVEL SYSTEM WITH AUTOMATIC DETECTOR ALIGNMENT

(71) Applicant: Milwaukee Electric Tool Corporation, Brookfield, WI (US)

(72) Inventors: Dennis Y. Wong, Glendale Heights, IL (US); Gareth J. Mueckl, Milwaukee, WI (US)

(73) Assignee: Milwaukee Electric Tool Corporation, Brookfield, WI (US)

(*) Notice: Subject to any disclaimer, the term of this patent is extended or adjusted under 35 U.S.C. 154(b) by 451 days.

(21) Appl. No.: 17/717,951

(22) Filed: Apr. 11, 2022

(65) Prior Publication Data

US 2022/0326011 A1 Oct. 13, 2022

Related U.S. Application Data

(63) Continuation of application No. PCT/US2022/024029, filed on Apr. 8, 2022.

(60) Provisional application No. 63/306,713, filed on Feb. 4, 2022, provisional application No. 63/288,963, filed on Dec. 13, 2021, provisional application No. 63/193,359, filed on May 26, 2021, provisional application No. 63/173,917, filed on Apr. 12, 2021, provisional application No. 63/173,793, filed on Apr. 12, 2021.

(51) Int. Cl.
*G01C 9/02* (2006.01)
*G01C 15/00* (2006.01)
*G01R 19/165* (2006.01)

(52) U.S. Cl.
CPC .............. *G01C 9/02* (2013.01); *G01C 15/002* (2013.01); *G01R 19/16571* (2013.01)

(58) Field of Classification Search
CPC ...... G01C 9/02; G01C 15/002; G01C 15/004; G01R 19/16571; G01J 1/42; G01J 1/4257; G01J 1/44; G01S 7/4863; G01S 7/4868; G01S 7/4873; G01S 17/003
See application file for complete search history.

(56) References Cited

U.S. PATENT DOCUMENTS

| 4,030,832 A | 6/1977 | Rando et al. |
| 4,108,539 A | 8/1978 | Gort et al. |
| 4,113,381 A | 9/1978 | Epstein |

(Continued)

FOREIGN PATENT DOCUMENTS

| CN | 105651269 | 6/2016 | |
| CN | 113795773 A | * 12/2021 | ............. G01S 17/10 |

(Continued)

OTHER PUBLICATIONS

International Search Report and Written Opinion for International Application No. PCT/US2022/024029, dated Jul. 18, 2022, 15 pages.

*Primary Examiner* — Yaritza Guadalupe-McCall
(74) *Attorney, Agent, or Firm* — Reinhart Boerner Van Deuren s.c.

(57) ABSTRACT

Various laser level systems that provide for automatic alignment between a laser level and a detector are shown. In one example, a laser level system processes a detected laser to determine an orientation of a detector with respect to the laser level. In another example, a laser level system processes a detected laser to determine a distance between the laser and the detector.

26 Claims, 31 Drawing Sheets

(56) References Cited

U.S. PATENT DOCUMENTS

| | | | |
|---|---|---|---|
| 4,335,306 A | 6/1982 | Gort et al. | |
| 4,346,989 A | 8/1982 | Gort et al. | |
| 4,693,598 A | 9/1987 | Sehr | |
| 4,820,041 A | 4/1989 | Davidson et al. | |
| 5,189,484 A | 2/1993 | Koschmann et al. | |
| 5,343,033 A | 8/1994 | Cain | |
| 5,471,049 A | 11/1995 | Cain | |
| 5,620,571 A * | 4/1997 | Bahns | H05H 3/04 422/186 |
| 5,784,155 A | 7/1998 | Ohtomo et al. | |
| 5,894,123 A | 4/1999 | Ohtomo et al. | |
| 6,011,613 A | 1/2000 | Ohtomo et al. | |
| 6,043,480 A * | 3/2000 | Sakamoto | G01J 1/44 356/218 |
| 6,075,586 A | 6/2000 | Ohtomo et al. | |
| 6,249,338 B1 | 6/2001 | Ohtomo et al. | |
| 6,452,668 B1 | 9/2002 | Pratt | |
| 6,459,483 B1 | 10/2002 | Shafer et al. | |
| 6,519,029 B1 | 2/2003 | Hedges et al. | |
| 6,618,133 B2 | 9/2003 | Hedges et al. | |
| 6,621,565 B2 | 9/2003 | Pratt et al. | |
| 6,630,993 B1 | 10/2003 | Hedges et al. | |
| 6,662,103 B1 | 12/2003 | Skolnick et al. | |
| 6,693,706 B2 | 2/2004 | Kahle et al. | |
| 6,741,343 B2 | 5/2004 | Shafer et al. | |
| 6,750,953 B1 | 6/2004 | Douglas | |
| 6,873,413 B2 | 3/2005 | Douglas | |
| 6,934,012 B2 | 8/2005 | Inaba et al. | |
| 7,019,278 B2 | 3/2006 | Douglas | |
| 7,323,673 B1 | 1/2008 | Ake et al. | |
| 7,339,154 B2 | 3/2008 | Katayama | |
| 7,409,312 B1 * | 8/2008 | Conner | G01C 15/004 702/159 |
| 7,476,846 B2 | 1/2009 | Ishio et al. | |
| 7,760,369 B2 | 7/2010 | Sehr | |
| 7,838,808 B1 | 11/2010 | Ake | |
| 8,087,176 B1 | 1/2012 | Hayes et al. | |
| 8,098,367 B2 | 1/2012 | Kirk et al. | |
| 8,132,334 B2 | 3/2012 | Winistoerfer | |
| 8,281,495 B2 | 10/2012 | Hayes et al. | |
| 8,595,946 B2 | 12/2013 | Hayes et al. | |
| 8,605,274 B2 | 12/2013 | Schumacher | |
| 8,619,250 B2 | 12/2013 | Hayashi et al. | |
| 8,711,369 B2 | 4/2014 | Campagna | |
| 8,720,074 B2 | 5/2014 | Amor | |
| 8,745,884 B2 | 6/2014 | Hayes | |
| 8,857,068 B2 | 10/2014 | Kodaira | |
| 8,869,411 B2 | 10/2014 | Lukie et al. | |
| 8,943,701 B2 | 2/2015 | Hayes et al. | |
| 9,188,441 B2 | 11/2015 | Munroe et al. | |
| 9,200,900 B2 | 12/2015 | Fessler et al. | |
| 9,222,772 B2 | 12/2015 | Munroe et al. | |
| 9,228,837 B2 * | 1/2016 | Dumoulin | G01J 1/44 |
| 9,360,317 B2 * | 6/2016 | Munroe | H03F 3/087 |
| 9,772,399 B2 | 9/2017 | Schwarz et al. | |
| 9,880,022 B1 | 1/2018 | Unger | |
| 9,971,024 B2 | 5/2018 | Schwarz et al. | |
| 10,006,766 B2 | 6/2018 | Hinderling et al. | |
| 10,145,676 B2 | 12/2018 | Hayes et al. | |
| 10,228,247 B2 | 3/2019 | Essling | |
| 10,240,949 B2 * | 3/2019 | Peters | G01C 15/004 |
| 10,451,715 B2 | 10/2019 | Chu | |
| 10,564,033 B2 | 2/2020 | Lukie et al. | |
| 10,670,398 B2 | 6/2020 | Essling | |
| 10,684,129 B2 | 6/2020 | Lukie et al. | |
| 10,697,796 B2 | 6/2020 | Lukie et al. | |
| 10,823,565 B2 | 11/2020 | Winter et al. | |
| 10,895,472 B2 | 1/2021 | Lukie | |
| 10,935,369 B2 | 3/2021 | Hayes et al. | |
| 11,092,438 B2 * | 8/2021 | Seitz | G01C 3/08 |
| 11,105,626 B2 | 8/2021 | Essling | |
| 11,112,242 B2 * | 9/2021 | Seitz | G01C 3/08 |
| 11,119,202 B2 | 9/2021 | Shi et al. | |
| 11,181,626 B2 | 11/2021 | Chu | |
| 11,754,393 B2 * | 9/2023 | Gould | G01C 15/008 33/228 |
| 11,768,072 B2 * | 9/2023 | Shi | G01S 11/12 356/3.09 |
| 2004/0264524 A1 | 12/2004 | Ochiai et al. | |
| 2005/0231709 A1 | 10/2005 | Inaba et al. | |
| 2007/0216878 A1 | 9/2007 | Shoji et al. | |
| 2014/0203172 A1 * | 7/2014 | Munroe | G01J 1/44 250/208.2 |
| 2014/0338205 A1 * | 11/2014 | Dumoulin | G01C 15/002 33/290 |
| 2020/0240783 A1 | 7/2020 | Eidinger et al. | |
| 2020/0249016 A1 * | 8/2020 | Shi | G01C 3/00 |
| 2020/0249336 A1 * | 8/2020 | Shi | G01S 17/08 |
| 2020/0355499 A1 | 11/2020 | Hinderling et al. | |
| 2022/0326011 A1 * | 10/2022 | Wong | G01J 1/42 |
| 2024/0159532 A1 * | 5/2024 | Gould | G01C 15/105 |
| 2024/0243547 A1 * | 7/2024 | Zeisler | H01S 5/0428 |

FOREIGN PATENT DOCUMENTS

| | | | |
|---|---|---|---|
| DE | 2326560 | 9/1982 | |
| DE | 202013009045 | 1/2014 | |
| DE | 102019103399 | 8/2019 | |
| EP | 1038158 | 12/2005 | |
| EP | 1203930 | 2/2007 | |
| EP | 3428683 | 8/2019 | |
| EP | 3428683 B1 * | 8/2019 | G01C 15/002 |
| WO | WO20141069 | 7/2020 | |

* cited by examiner

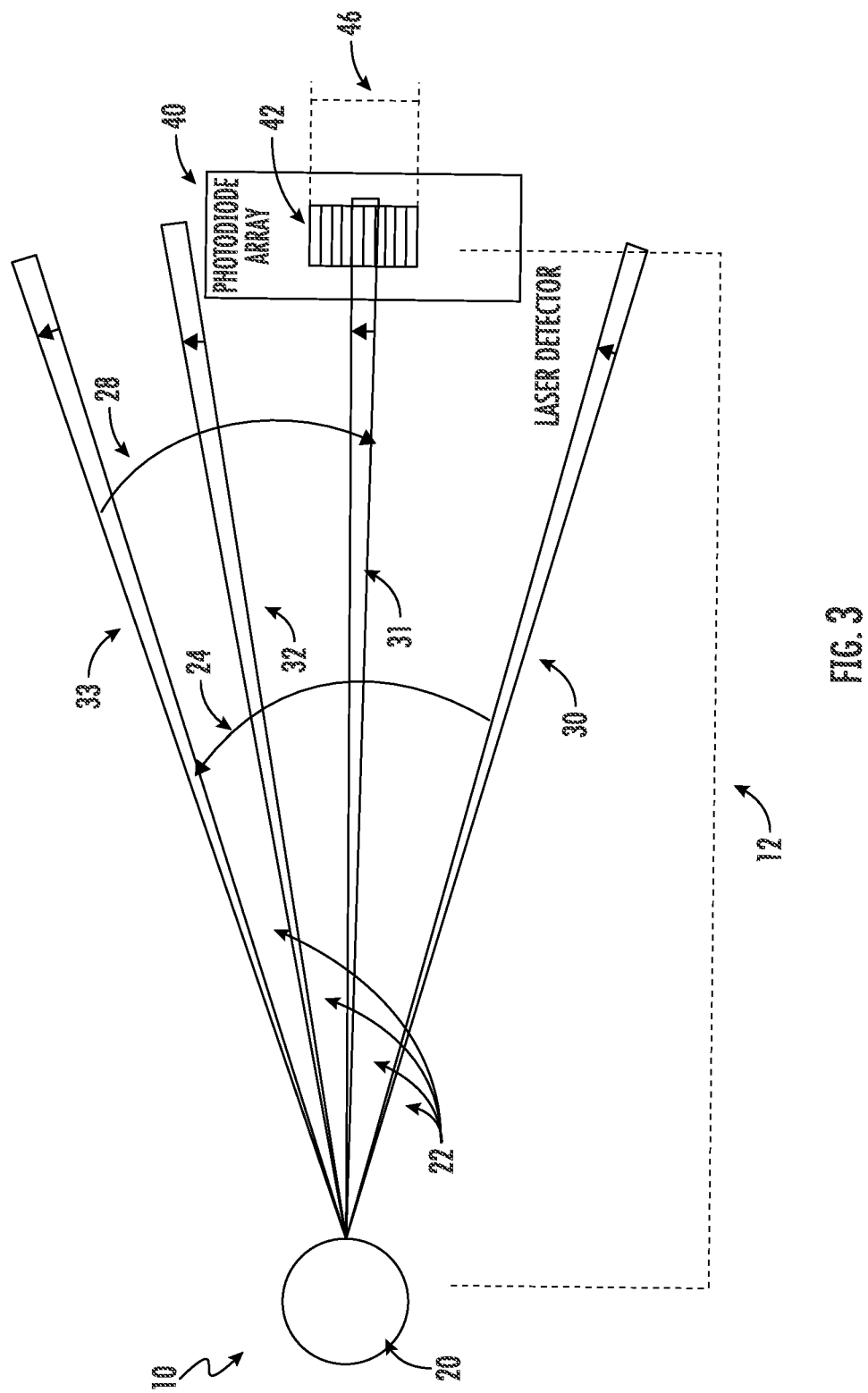

LASER LEVEL SYSTEM WITH AUTOMATIC DETECTOR ALIGNMENT

CROSS-REFERENCE TO RELATED PATENT APPLICATIONS

The present application is a continuation of International Application No. PCT/US2022/024029, filed Apr. 8, 2022, which claims the benefit of and priority to U.S. Provisional Application No. 63/306,713, filed on Feb. 4, 2022, U.S. Provisional Application No. 63/288,963, filed on Dec. 13, 2021, U.S. Provisional Application No. 63/193,359, filed on May 26, 2021, U.S. Provisional Application No. 63/173,917, filed on Apr. 12, 2021, and U.S. Provisional Application No. 63/173,793, filed on Apr. 12, 2021, which are incorporated herein by reference in their entireties.

BACKGROUND OF THE INVENTION

The present invention relates generally to the field of tools. The present invention relates specifically to a laser projection device, such as a planar laser level, a rotary laser level, a point laser level, etc., that projects one or more lasers onto a work piece or work surface.

SUMMARY OF THE INVENTION

One embodiment of the invention relates to a method of operating a laser level system that includes a laser level and detector. The method includes emitting a laser, such as a vertical planar laser beam, from the laser level, and rotating the laser beam with respect to the laser level such that the laser beam traverses across the detector. The method includes pulsing the laser at a known rate. A detector receives the laser and counts a number of pulses of the laser. The laser level system calculates a distance between the laser level and the detector based at least in part on the known pulse rate, the number of pulses detected, and/or a width of the detector panel that detected the laser. In a specific embodiment, the laser is emitted from the laser level in a vertical planar beam and the laser is rotated with respect to the laser level at a speed between 5 RPM and 30 RPM. In a specific embodiment, a laser level system is configured to practice the first method.

Another embodiment of the invention relates to a method of detecting a laser incident on a laser level detector received from a laser level. The method includes emitting a laser from a laser level and receiving the laser at a detector. A first signal, such as an electronic signal, is generated by the detector based on the received laser. The detector receives a second signal indicating a distance between the laser level and the detector, such as via analysis of the laser. The detector generates a third signal based on the distance and the first signal. In a specific embodiment, the third signal is an amplification of the first signal. In a specific embodiment, the detector includes amplification circuitry, and the detector adjusts a gain of the amplification circuitry based on the third signal. In a specific embodiment, a laser level system is configured to practice the second method.

In one aspect, embodiments of the invention provide, a laser level light detection system is configured to detect laser light from a laser level. The detection system includes a first photodiode array and a second photodiode array. Each photodiode array includes two or more photodiodes connected in parallel. The first and second photodiode arrays are arranged to receive laser light from a laser level, and further configured to generate an electrical output in response to the laser light. A first multistage amplifier is arranged to amplify an output of the first photodiode array, and a second multistage amplifier is arranged to amplify an output of the second photodiode array. Each multistage amplifier has at least three outputs each with a different gain. A first microcontroller unit configured to receive outputs from the first multistage amplifier, and further configured to choose a single output from among the at least three levels of gain, and a second microcontroller unit configured to receive outputs from the second multistage amplifier, and further configured to choose a single output from among the at least three levels of gain.

In a particular embodiment, the first multistage amplifier includes a low amplification gain output, a medium amplification gain output, and a high amplification gain output. The laser light detection system further includes a first comparator coupled between the high amplification gain output and the first microcontroller unit. In more particular embodiments, the second multistage amplifier includes a low amplification gain output, a medium amplification gain output, and a high amplification gain output. The laser light detection system further includes a second comparator coupled between the high amplification gain output and the second microcontroller unit. In a further embodiment, the first microcontroller unit is configured to count a number of pulses generated by the first comparator in order to determine a distance between the first photodiode array and a source of laser light. In a more particular embodiment, the second microcontroller unit is configured to count a number of pulses generated by the second comparator in order to determine a distance between the second photodiode array and the source of laser light.

In some embodiments, the laser level light detection system further includes a first light intensity module coupled to the first photodiode array, and also includes a second light intensity module coupled to the second photodiode array. Each light intensity module is configured to deactivate one or more photodiodes in the photodiode array to which it is coupled. The first light intensity module may include one or more switches coupled respectively to the one or more photodiodes in the first photodiode array, such that each of the one or more switches, when opened, is configured to deactivate a respective photodiode. Furthermore, the second light intensity module may include one or more switches coupled respectively to the one or more photodiodes in the second photodiode array, such that each of the one or more switches, when opened, is configured to deactivate a respective photodiode. The first light intensity module may be configured to provide a bias voltage to one or more photodiodes in the first photodiode array. Similarly, the second light intensity module may be configured to provide a bias voltage to one or more photodiodes in the second photodiode array. Additionally, the first light intensity module may be configured to provide an electrical signal indicative of an intensity of light incident upon the first photodiode array. Similarly, the second light intensity module may be configured to provide an electrical signal indicative of an intensity of light incident upon the second photodiode array.

In a particular embodiment, the laser level light detection system also includes a first high-pass filter and first transimpedance amplifier coupled between the first photodiode array and the first multistage amplifier. The output of the first photodiode array is input to the first high-pass filter whose output is input to the first transimpedance amplifier, whose output is input to the first multistage amplifier. Furthermore, the laser level light detection system may include a second high-pass filter and second transimpedance amplifier coupled between the second photodiode array and the second multistage amplifier. The output of the second photodiode array is input to the second high-pass filter whose output is input to the second transimpedance amplifier, whose output is input to the second multistage amplifier. In a further embodiment, an amplification of the output of the first photodiode array is adjusted based on a distance between a laser light source and the first photodiode array.

In another aspect, embodiments of the invention provide a method of operating a laser level light detection system. The method includes the steps of providing a first photodiode array and a second photodiode array wherein each photodiode array includes two or more photodiodes connected in parallel, and arranging the first and second photodiode arrays to receive laser light from a laser level. The first and second photodiode arrays are configured to generate an electrical output in response to the laser light. The method calls for amplifying a first output of the first photodiode array, and amplifying a second output of the second photodiode array. Amplifying the output of the first and second photodiode array includes simultaneously providing more than one amplified output for each photodiode array, such that each of the more than one amplified outputs for the first photodiode array has a different level of amplification, and each of the more than one amplified outputs for the second photodiode array has a different level of amplification. The method further calls for automatically selecting one first array output from the more than one amplified outputs of the first photodiode array, and providing the selected one first-array output as a system output of the first photodiode array, and selecting one second array output from the more than one amplified outputs of the second photodiode array, and providing the selected one second-array output as a system output of the second photodiode array.

In a particular embodiment, the method requires simultaneously providing a low-gain amplification output, a medium-gain amplification output, and a high-gain amplification output for each of the first and second photodiode arrays. In a further embodiment, the method calls for automatically selecting one output from the low-gain output, medium-gain output, and high-gain amplification output of the first photodiode array, and providing the selected one output as an output of the first photodiode array. Similarly, the method may also include automatically selecting one output from the low-gain output, medium-gain output, and high-gain amplification output of the second photodiode array, and providing the selected one output as an output of the second photodiode array.

In certain embodiments, the method includes the step of determining a distance between the first photodiode array and a source of laser light. Further, determining a distance between the first photodiode array and a source of laser light may call for counting a number of laser beam pulses during a first sweep of a laser beam over the first array of photodiodes. The method may further require the step of applying a first negative bias voltage to the first photodiode array during counting of laser beam pulses. In a further embodiment, the method calls for deactivating some photodiodes in the first photodiode array and applying a second negative bias voltage to the first photodiode array before a second sweep of the laser beam over the first array of photodiodes, where the second negative bias voltage is less that the first negative bias voltage.

In a particular embodiment, the method requires automatically aligning the laser beam during the second sweep by stopping the sweep and focusing the laser beam on that point on the first photodiode array where a first current generated from a first end of the first photodiode array is equal to a second current generated from a second end of the first photodiode array opposite the first end.

In yet another aspect, embodiments of the invention provide a method of operating a laser level light detection system. The method includes the steps of providing an array of photodiodes coupled in parallel, and arranging the array of photodiodes to receive laser light from a laser level, the photodiode array configured to generate an electrical output in response to the laser light. The method further includes maintaining a first reverse bias voltage across the array of photodiodes while a first pulsed laser beam sweeps over each photodiode in the array of photodiodes. The method also calls for counting a number of laser beam pulses during the sweep of the laser beam over the array of photodiodes, then determining a distance from the array of photodiodes to a source of the pulsed laser beam based on the number of counted laser beam pulses. The method also includes determining a best gain for amplification of an output from the array of photodiodes, and applying a second reverse bias voltage across the array of photodiodes, while a second pulsed laser beam sweeps over each photodiode in the array of photodiodes. The second reverse bias voltage is less than the first reverse bias voltage.

In certain embodiments, the method includes deactivating one or more photodiodes in the array of photodiodes. In a further embodiment, the array of photodiodes is arranged linearly such that individual photodiodes are positioned adjacently in a line from a first end of the array to a second end of the array, and the method further includes deactivating one or more photodiodes in the array of photodiodes comprises deactivating one photodiode at the first end of the array and deactivating one photodiode at the second end of the array. Furthermore, deactivating one or more photodiodes in the array of photodiodes may call for deactivating two photodiodes at the first end of the array and deactivating two photodiodes at the second end of the array. In a further embodiment, the array of photodiodes is arranged linearly such that individual photodiodes are positioned adjacently in a line from a first end of the array to a second end of the array, the array of photodiodes configured to provide a first current output from the first end and a second current output from the second end.

In some embodiments, the method includes the step of transmitting a signal that indicates when the first current output is above a threshold current and equal to the second current output, thus indicating laser alignment. In certain particular embodiments, the first current output is from one half of the photodiodes in the array of photodiodes, and the second current output is from the remaining half of the photodiodes in the array of photodiodes. The method may also require the step of activating the deactivated one or more photodiodes after laser alignment.

In some embodiments, maintaining the first reverse bias voltage across the array of photodiodes may include maintaining the first reverse bias voltage of at least two volts. Furthermore, maintaining the first reverse bias voltage across the array of photodiodes may include maintaining the first reverse bias voltage of at least 18 volts. Moreover, applying the second reverse bias voltage across the array of photodiodes may include applying the second reverse bias voltage of less than three tenths of a volt. Alternatively, applying the second reverse bias voltage across the array of photodiodes may include applying the second reverse bias voltage of less than two volts.

In a further aspect, embodiments of the invention provide a laser level light detection system configured to detect laser light from a laser level. The detection system includes only a single photodiode. The single photodiode is arranged to receive laser light from a laser level, and further configured to generate an electrical output in response to the laser light. A Fresnel lens is arranged in spaced relation to the single photodiode so as to direct laser light onto the single photodiode. A multistage amplifier is arranged to amplify an output of the single photodiode. The multistage amplifier has at least three outputs each with a different gain. A microcontroller unit is configured to receive outputs from the multistage amplifier, and further configured to choose a single output from among the at least three levels of gain.

In certain embodiments, the Fresnel lens has a negative focal length. Further, the Fresnel lens may be made of plastic. The Fresnel lens may be positioned between 12 and 18 millimeters from the photodiode. In particular embodiments, the multistage amplifier has at least four outputs each with a different gain. Furthermore, the multistage amplifier may include a low amplification gain output, a medium amplification gain output, a high amplification gain output, and a highest amplification gain output, and the laser light detection system may further include a comparator coupled between the highest amplification gain output and the microcontroller unit.

In a further embodiment, the microcontroller unit is configured to count a number of pulses generated by the comparator in order to determine a distance between the single photodiode array and a source of laser light. The laser level light detection system may further include a high-pass filter and transimpedance amplifier coupled between the single photodiode and the multistage amplifier, such that the output of the single photodiode is input to the high-pass filter, and the high-pass filter output is input to the transimpedance amplifier, where the transimpedance amplifier output is input to the multistage amplifier.

In some embodiments, the laser level light detection system also has a light intensity module coupled to the single photodiode, where the intensity module is configured to provide an electrical signal indicative of an intensity of light incident upon the single photodiode. The light intensity module may be configured to provide a bias voltage to the single photodiode. Further, the light intensity module may be configured to deactivate the single photodiode via a switch coupled between the light intensity module and the single photodiode.

In certain embodiments, the Fresnel lens is configured to spread the laser light such that during a sweep across the photodiode, the laser light is incident on an area larger than an area of the photodiode. Furthermore, the microcontroller unit may be configured to detect a maximum intensity for the output of the single photodiode, and further configured to set a reverse bias voltage for the single photodiode based on the detected maximum intensity.

In yet another aspect, embodiments of the invention provide a method of operating a laser level light detection system. The method calls for providing a photodiode, and arranging the photodiode to receive laser light from a laser level, where the photodiode is configured to generate an electrical output in response to the laser light. The method further includes applying a reverse bias voltage to the photodiode, and amplifying an output of the photodiode, where amplifying the output of the photodiode includes simultaneously providing more than one amplified output, such that each of the more than one amplified outputs has a different level of amplification, The method further includes determining a distance between the photodiode and a laser light source, and adjusting the reverse bias voltage to improve a signal-to-noise ratio for the amplified output of the photodiode.

In a particular embodiment, the method also includes the step of automatically selecting one output from the more than one amplified outputs of the photodiode based on the determined distance, and providing the selected one output as a system output of the photodiode. Providing more than one amplified output may include providing a low-gain amplification output, a medium-gain amplification output, and a high-gain amplification output. Further, determining a distance between the photodiode and the source of laser light may call for counting a number of laser beam pulses during a first sweep of a laser beam over photodiode. The method may also include providing a photodiode comprises providing a photodiode array.

In some embodiments, the method includes transmitting a control signal to the laser light source to align a laser beam from the laser light source at a point of maximum intensity for photodiode output. The method may also include the step of determining a signal-to-noise ratio for the amplified output of the photodiode, and determining a set point for adjusting the reverse bias voltage.

In a further embodiment, the method calls for selecting a single system output from the more than one amplified outputs. Selecting the single system output from the more than one amplified outputs may include selecting the single system output from the more than one amplified outputs based on the determined distance between the photodiode and the laser light source. Additionally, the method may include saving a maximum analog reading of the output of the photodiode, and transmitting a signal, based on the maximum analog reading, to control a motor that rotates the laser level.

In still another aspect, embodiments of the invention provide a method of operating a laser level light detection system. The method includes the step of arranging a photodiode array to receive laser light from a laser level. The photodiode array is configured to generate an electrical output in response to the laser light. The method includes sweeping a laser beam across the photodiode array, the laser light pulsing at a first duty cycle rate, and aligning the laser beam on the photodiode array such that a first current generated from a first end of the photodiode array is equal to a second current generated from a second end of the photodiode array opposite the first end. The method also calls for causing the laser light to pulse at a second duty cycle rate, the second duty cycle rate being higher than the first duty cycle rate.

In particular embodiments, the method includes pulsing the laser light at a first duty cycle rate comprises pulsing the laser light at a duty cycle of less than 25 percent. Alternatively, the method may call for pulsing the laser light at a first duty cycle rate comprises pulsing the laser light at a duty cycle of less than 10 percent. In another embodiment, the method requires causing the laser light to pulse at a second duty cycle rate comprises causing the laser light to pulse at a duty cycle greater than 75 percent. Alternatively, the method may include causing the laser light to pulse at a second duty cycle rate comprises causing the laser light to pulse at a duty cycle greater than 90 percent.

Additional features and advantages will be set forth in the detailed description which follows, and, in part, will be readily apparent to those skilled in the art from the description or recognized by practicing the embodiments as described in the written description included, as well as the appended drawings. It is to be understood that both the foregoing general description and the following detailed description are exemplary.

The accompanying drawings are included to provide further understanding and are incorporated in and constitute a part of this specification. The drawings illustrate one or more embodiments and, together with the description, serve to explain principles and operation of the various embodiments.

BRIEF DESCRIPTION OF THE DRAWINGS

This application will become more fully understood from the following detailed description, taken in conjunction with the accompanying figures, wherein like reference numerals refer to like elements in which:

FIG. 3 is a schematic top view of the laser level system of FIG. 1, according to an exemplary embodiment.

Figure 1:
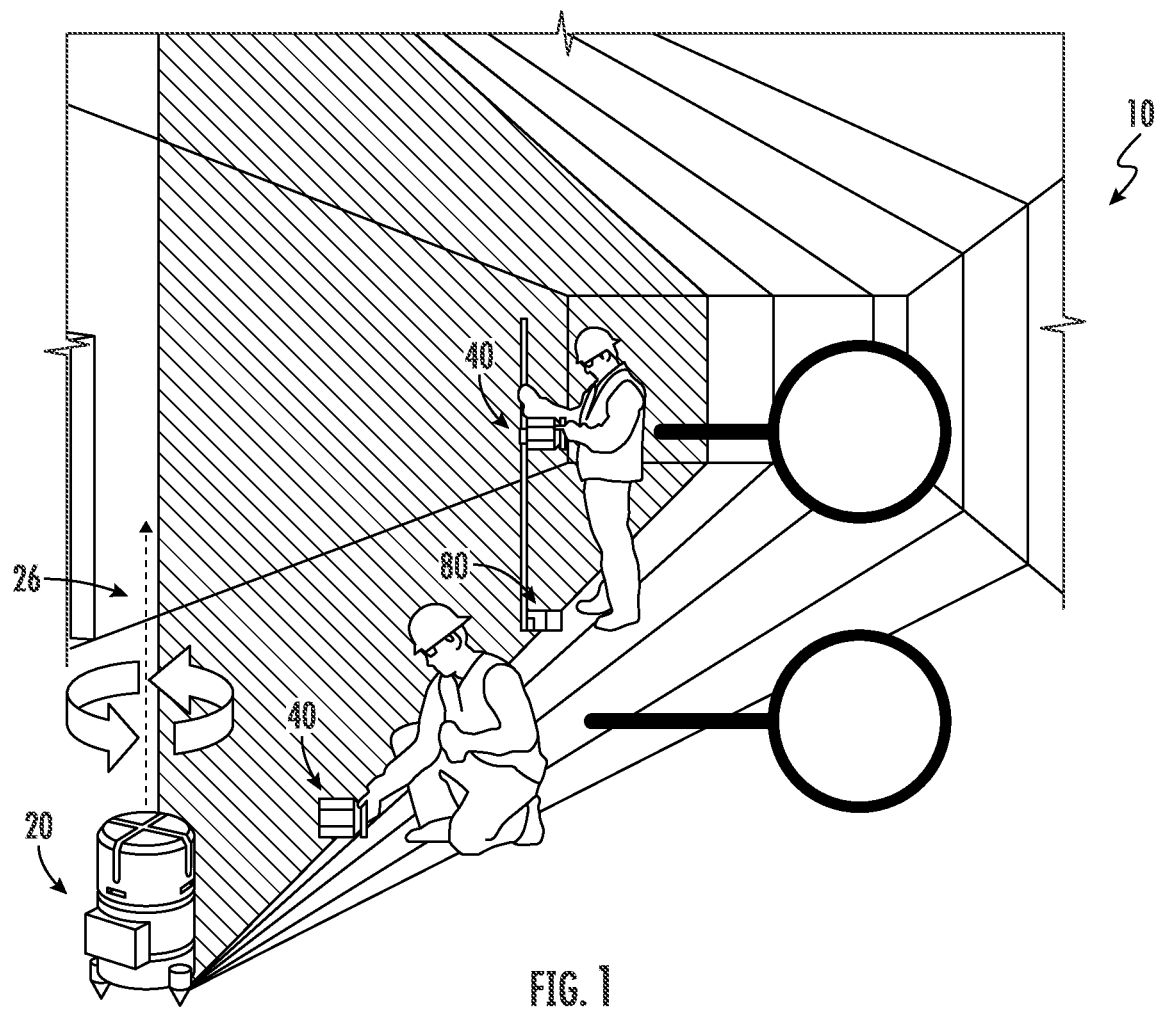
FIG. 1 is a perspective view of a laser level system, according to an exemplary embodiment.
Figure 2A:
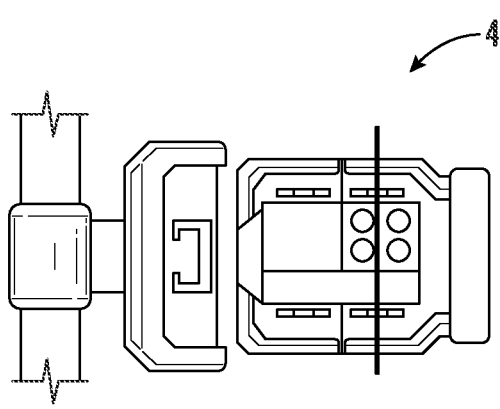
FIG. 2A is a front view of a detector of the laser level system of FIG. 1, according to an exemplary embodiment.
Figure 2B:
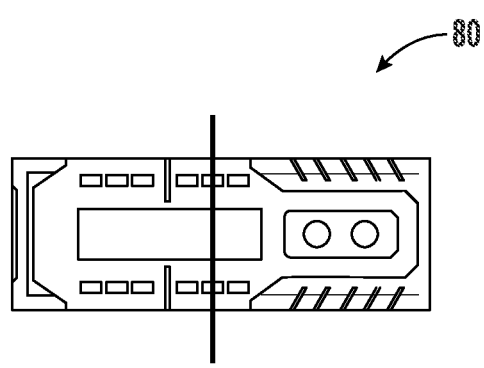
FIG. 2B is a front view of a detector of the laser level system of FIG. 1, according to another exemplary embodiment.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION

Referring generally to the figures, various embodiments of a laser level system, including a laser level and a laser level detector, are shown. As discussed herein, Applicant has developed a number of improvements to the functionality and/or control of laser levels. After positioning laser levels and/or detectors, it can sometimes be desirable to determine the alignment and/or distance between the laser level and detector. These determinations can be used for various purposes such as controlling the automatic alignment of the laser level with the detector. In particular, Applicant has developed a laser level system that includes a laser level and detector that includes the ability for the laser level to automatically control the projected position of the laser such that it is moved to align with the detector. Providing a laser level with this functionality reduces setup time by removing the need for a second person to help during setup and/or for a single user to repeatedly walk between points to make micro adjustments. In a specific embodiment, the laser level automatically aligns a vertical planar beam to the detector which further reduces setup time.

In specific embodiments, the laser level system discussed herein provides various designs and techniques for improving the auto alignment function, particularly in the context of an automatic aligning a vertical planar laser. In a specific embodiment, the laser level system determines the distance between a laser level and a detector and uses the detected distance to control the gain/amplification of the detector circuitry. This allows for improved automatic alignment of the laser level by increasing the operational range (e.g., the distance between laser level and detector) of the automatic alignment feature.

In various embodiments, Applicant has developed several specific systems, hardware and methods for determining distance between laser level and detector.

In one embodiment, a laser from a laser level is detected at a detector. The laser emitted by the laser is emitted at a known pulse rate (e.g., 10 kHz) and rotated with respect to the laser level such that the laser beam traverses across the detector at a known rotational speed. The detector analyzes the received laser to determine a number of pulses that were detected while the laser transited the detector panel. The detector calculates a distance between the laser level and the detector based on the number of pulses detected and a dimension (e.g., width) of the detector panel. In some embodiments, the detector amplifies the signal generated by the laser based on a determined distance between the laser level and the detector.

Referring to FIGS. 1-4, a laser level system, shown as laser measuring system 10, is shown according to an exemplary embodiment. Laser measuring system includes laser level 20 and detector 40. Laser level 20 emits a laser reference beam, shown as vertical planar laser beam 22. In the embodiment shown, laser level 20 is configured to rotate about a vertical axis 26 such that laser beam 22 is moved in the generally horizontal direction. As will be discussed in more detail herein, laser measuring system 10 is configured such that laser level 20 is automatically controlled to rotate laser beam 22 to align with a portion of detector 40 (e.g., such as the center of a detector photodiode array of detector 40). In general, laser system 10 is configured to determine the position of laser beam 22 relative to detector 40 and then to control rotation of laser level 20 such that laser beam 22 is projected in the desired position relative to detector 40.

Figure 4:
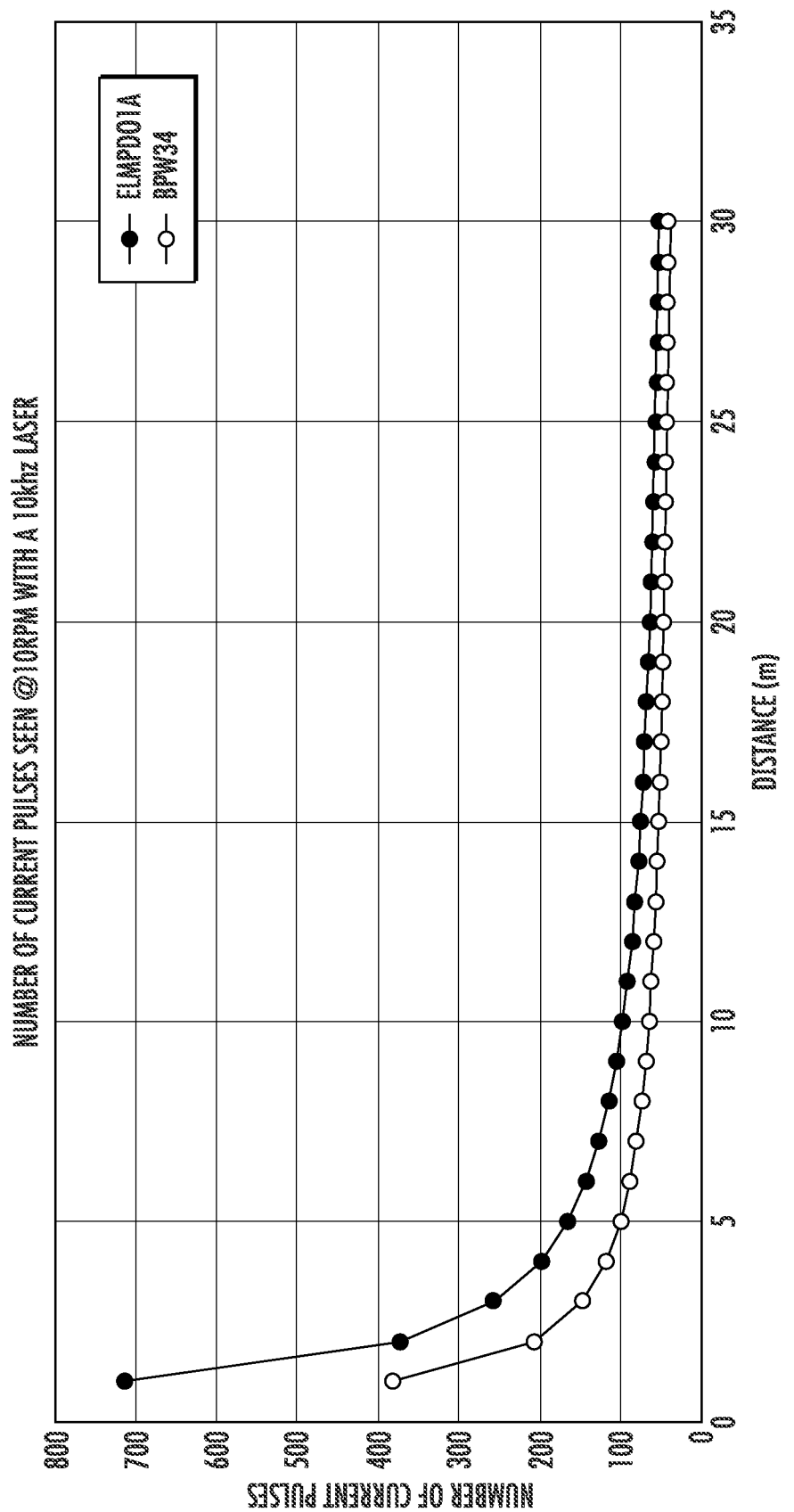
FIG. 4 is a graphical illustration showing the relationship between the number of current pulses and the distance between the laser level and light detector, according to an exemplary embodiment.

Referring to FIG. 4, details of the automatic alignment process are shown. While laser level 20 and detector 40 are being aligned, laser beam 22 from laser level 20 is rotated relatively slowly (e.g., at 10 RPM) such that laser beam 22 traverses across detector panel 42 of detector 40. In a specific embodiment, laser 22 is rotated in direction 24 with respect to laser level 20 between 5 RPM and 30 RPM, and more specifically at 10 RPM. As shown, laser beam 22 is rotating in direction 24 such that at time zero ($T_0$) laser beam 22 is emitted along path 30, at time one ($T_1$) laser 22 is emitted along path 31, at time two ($T_2$) laser beam 22 is emitted along path 32, at time three ($T_3$), laser beam 22 is emitted along path 33.

When detector 40 detects laser beam 22, detector 40 communicates to laser level 20 that laser beam 22 has been detected. Because of the time for detector 40 to determine that laser beam 22 was received, and because of the time to communicate from detector 40 to laser level 20 that laser beam 22 was received, laser level 20 may have continued rotating laser beam 22 past detector panel 42. In the example show, laser beam 22 has been rotated to path 33. When laser level 20 receives an indication that laser beam 22 was detected by detector 40, laser level 20 rotates laser beam 22 in direction 28 opposite direction 24 until laser beam 22 is aligned detector panel 42, at which point detector 40 signals laser level 20 to stop rotating laser beam 22.

Laser beam 22 is received at detector 40 and/or at detector 80. In a specific embodiment, detector 40 and/or detector 80 are remote controls of laser level 20. Detector panel 42 (e.g., a photodiode array) of detector 40 detects laser beam 22 as laser beam 22 traverses the detector panel 42. Detector 40 determines a number of pulses that were detected by detector panel 42 while laser beam 22 was transiting detector panel 42. In a specific embodiment, detector 40 generates a signal, such as an electronic signal, based on the detected laser beam 22. Detector 40 analyzes the signal, such as by counting voltage spikes at a comparator, to count the number of pulses. A signal is generated that indicates the number of pulses counted. Distance 12 between laser level 20 and detector 40 is calculated based on the number of pulses detected by detector panel 42 and a dimension, shown as width 46, of detector panel 42. By determining the distance 12 between laser level 20 and detector 40, a microcontroller unit (MCU), for example, could then determine what gain or amplification is needed (e.g., higher gain at longer distances) for the signal from the detector 40 to obtain the most accurate reading for that signal.

An example is provided for illustrative purposes and illustrated in the graphical representation of FIG. 4 showing the relationship between the number of pulses and the distance between the laser level 20 and the detector 40. FIG. 4 includes two curves showing the number of pulses versus distance for two different light detectors. In this example, the laser level 20 is emitting laser beam 22 at a certain PWM frequency (i.e., 10,000 pulses per second). If detector panel 42 detects 50 pulses during a single transiting incident of laser beam 22 past detector panel 42, and the laser beam 22 is being rotated at 10 RPM, and detector panel 42 has a width of 20 mm, then detector 40 calculates that detector 40 is at or near 30 meters away from laser level 20. The rotation speed of the laser may be adjusted either automatically by the MCU or manually by a user as needed. If, for example, the detector 40 does not detect the laser at 10 RPM, the rotation speed may be decreased until sufficient readings are obtained.

As shown in FIG. 4, at longer distances, the two light detectors perform similarly. However, at distances less than five meters, the difference is noticeable. At a distance of one to two meters, one detector counts over 700 pulses while the other counts less than 400. Thus, it is advantageous to calibrate the system based on the particular light detector being used. As the number of pulses may not change much at distances between 15 and 30 meters, for example, precise calibration will aid in pinpointing the distance more accurately at longer ranges.

In various embodiments, laser system 10 uses the detected/calculated distance between laser level 20 and detector 40 to control operation of laser system 10. In particular embodiments, laser system 10 uses the detected/calculated distance between laser level 20 and detector 40 to control the gain/amplification of the signal from detector panel 42, e.g., increase the gain as distance increases. As a result, the effective range of the automatic alignment feature may be increased by increasing the gain (e.g., and therefore the sensitivity) of the detector circuitry when the distance increases. This allows for increased range without increasing the strength of the laser diode used in laser level 20.

In an exemplary use, detector 40 will initially process the signal generated by the received laser beam 22 with a very high gain. If the laser beam 22 is not sensed at the first revolution, the rotation speed of laser level 20 may be slowed down.

Referring to FIGS. 5-10, various embodiments of amplification circuitry/electronics for detector 40 are shown and described. In particular, FIGS. 5-10 show amplification circuitry 150, 152, 154, 156, 158, and/or 160 which each provide for variable gain/amplification of the signal generated by detector panel 42 in response to receiving laser beam 22, and as noted above, in various embodiments, the gain generated by amplification circuitry 150, 152, 154, 156, 158, and/or 160 varies based on the detected/calculated distance between laser level 22 and detector 40.

In various embodiments, a laser beam 22 is emitted by a laser level 20 and received at a detector 40. The detector 40 generates a first signal, such as an electronic signal, based on the intensity of the laser beam 22 received at the detector 40. The detector 40 receives a second signal indicating a distance between the laser level 20 and the detector 40. The detector 40 then generates a third signal based on the distance and the first signal, such as via one or more of amplification circuitry 150, 152, 154, 156, 158, and/or 160. The amplification circuitry adjustably amplifies the first signal based on the distance between the laser level 20 and the detector 40, such as by performing a larger amplification for longer distances and a smaller amplification for shorter distances. In a specific embodiment, the third signal is an amplification of the first signal.

Figure 5:
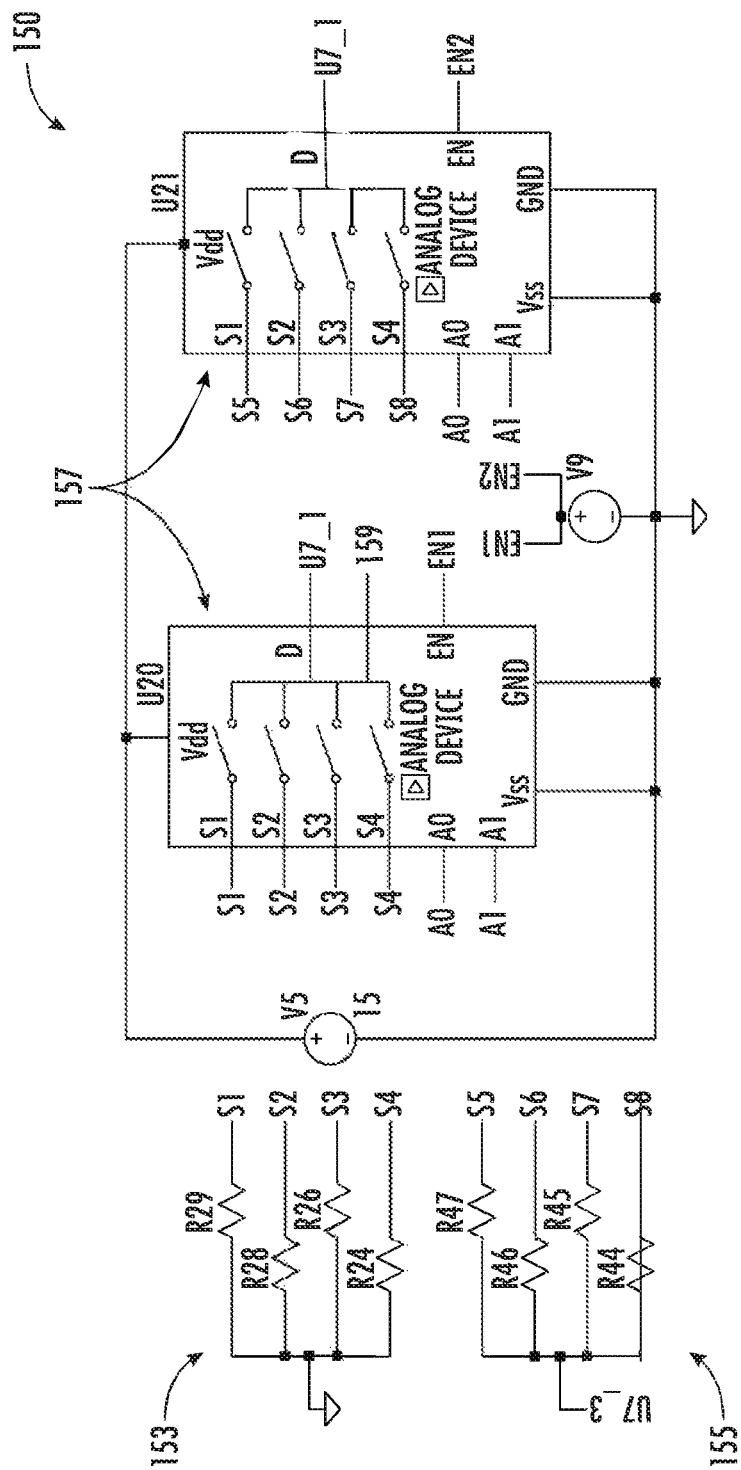
FIG. 5 is a schematic view of electronics of a laser level system, according to an exemplary embodiment.
Figure 6:
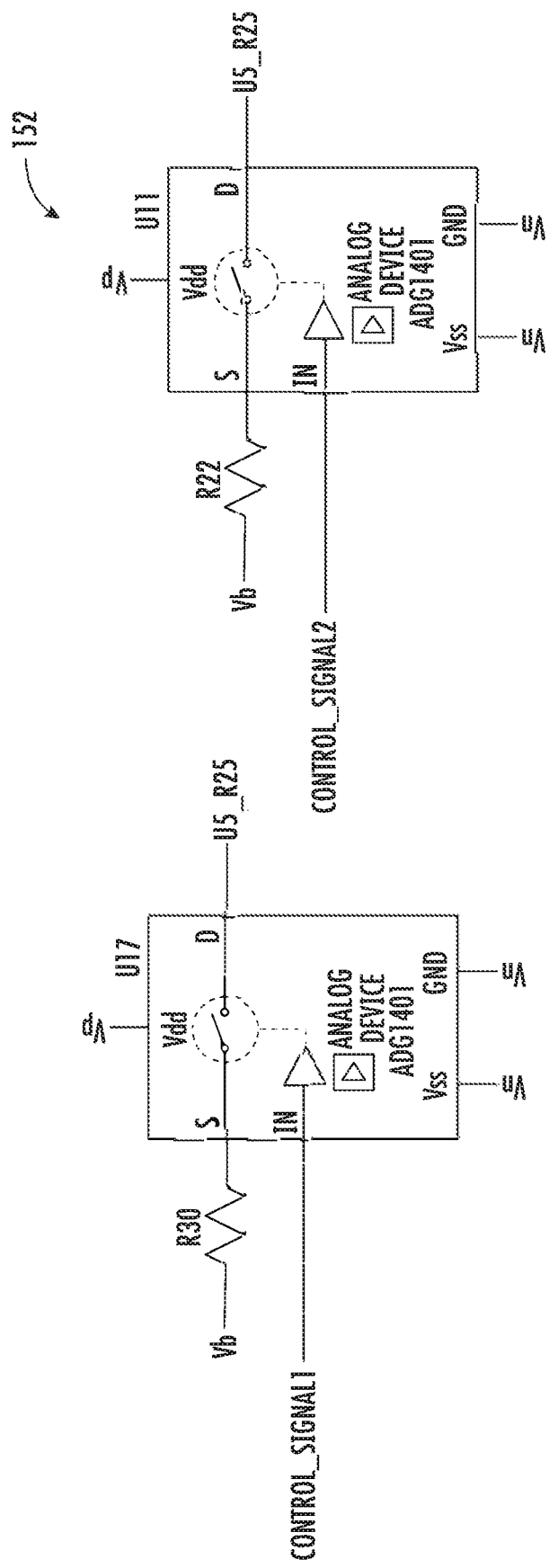
FIG. 6 is a schematic view of electronics of a laser level system, according to an exemplary embodiment.
Figure 7:
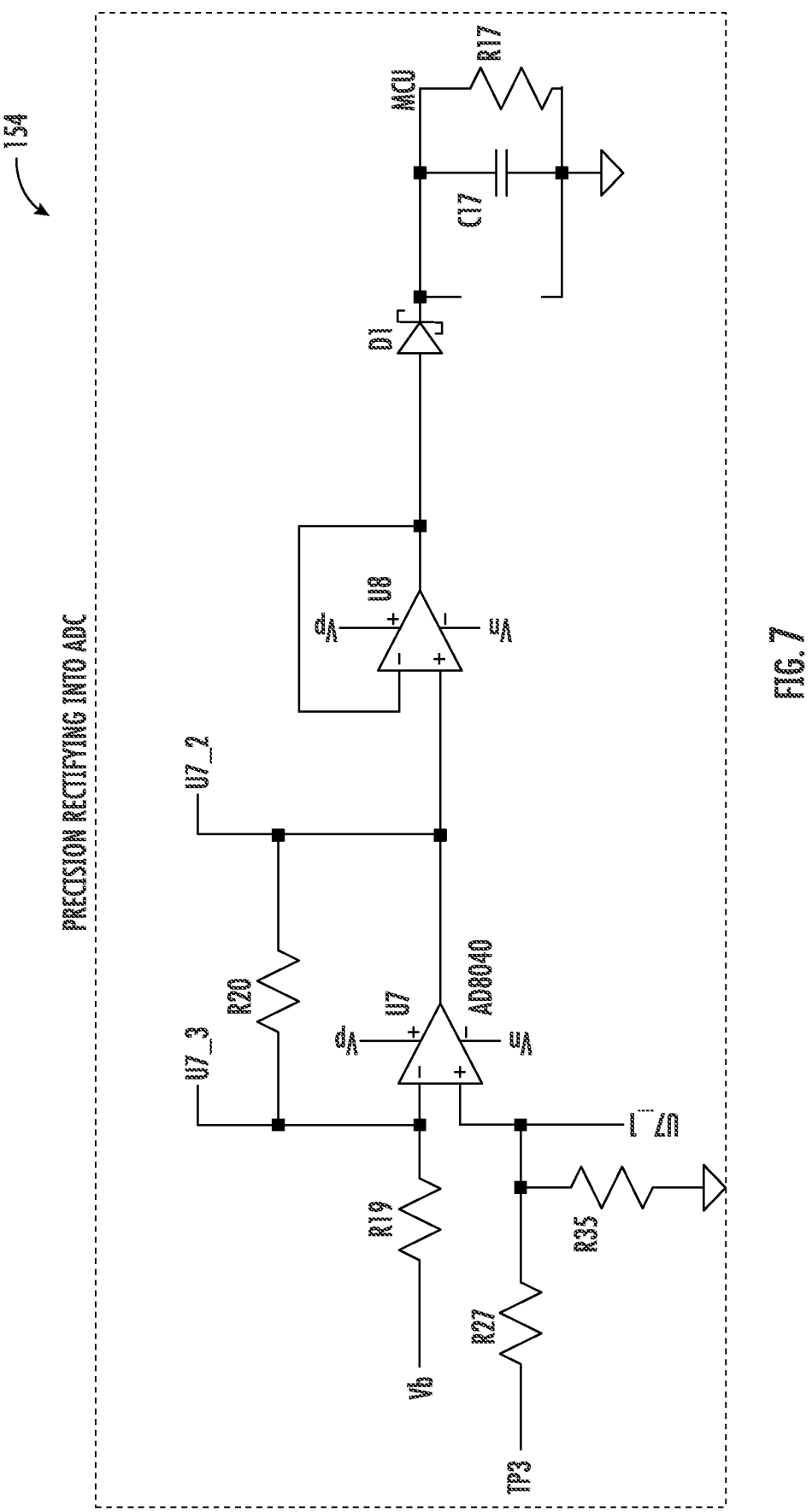
FIG. 7 is a schematic view of electronics of a laser level system, according to an exemplary embodiment.
Figure 8:
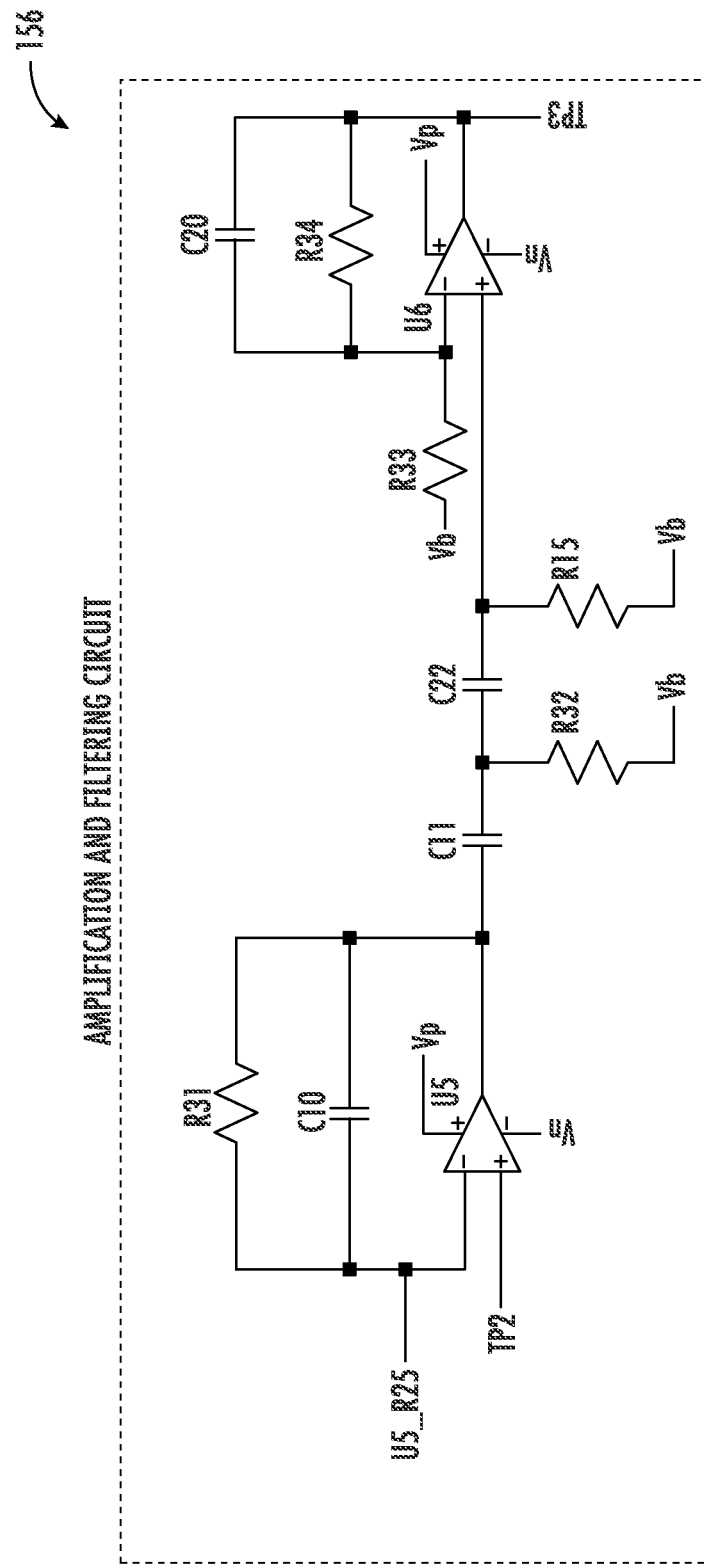
FIG. 8 is a schematic view of electronics of a laser level system, according to an exemplary embodiment.

Referring to FIGS. 5-8, according to an exemplary method of using a laser level system, the signal generated by detector 40 when receiving the laser beam 22 is processed by amplification circuitry 150, 152, 154, 156. The signal is adjustably amplified by adjusting the configuration of the electronics. Using multiplexed switches 157 in parallel with resistors in the feedback path is one way to accomplish this. For example, the feedback resistors of the electronics can be closed or opened based on an estimated distance between the laser level 20 and the detector 40. The magnitude of the amplification can be determined by a ratio of the feedback to the input resistances. FIG. 5 shows a first group 153 of four resistors and a second group 155 of four resistors each having resistors with values of 50 kΩ, 100 kΩ, 250 kΩ, and 500 kΩ in the embodiment shown. However, in other embodiments, the four resistors could have a range of values different from those shown in FIG. 5. The four resistors of the first and second groups 153, 155 are connected at one end while each of the other ends of the four resistors is connected to a respective switch 157 where each of the four switches 157 is normally open. The four switches 157 are connected at the terminal 159 not connected to the four resistors 153, 155. The first and second groups 153, 155 of resistors are coupled to different portions of an amplifier circuit with an op-amp 161, input resistors 163, and a feedback resistor 165 (shown in FIG. 9).

The first group 153 is placed in parallel with the feedback resistor 165 (shown in FIG. 9) such that closing any switch 157 coupled to the four resistors 153 places the resistor, connected to that switch 157, in parallel with the feedback resistor 165. This reduces the value of the feedback resistance. How much the feedback resistance is reduced depends on the value of the resistor with the closed switch 157. The second group 155 is placed in parallel with an input resistor 163 (shown in FIG. 9) to the non-inverting input of the op-amp 161 such that closing any switch 157 coupled to the four resistors of the second group 155, places the resistor, connected to that switch 157, in parallel with the input resistor 163. This reduces the value of the input resistance. How much the input resistance is reduced depends on the value of the resistor with the closed switch 157.

Figure 9:
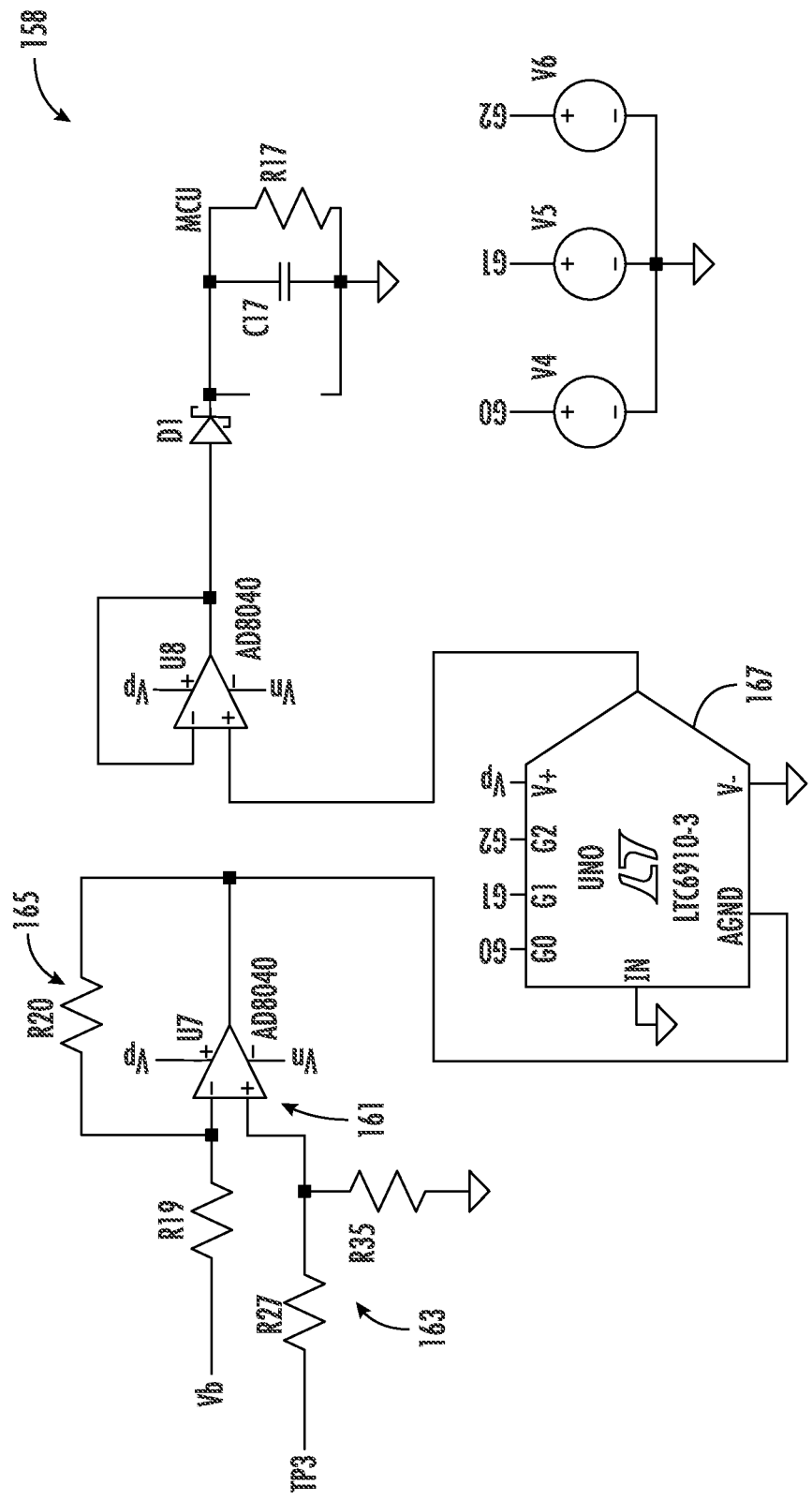
FIG. 9 is a schematic view of electronics of a laser level system, according to an exemplary embodiment.

Referring to FIG. 9, according to an exemplary method of using a laser level system, the signal generated by the detector 40 when receiving the laser beam 22 is processed by amplification circuitry 158. Amplification circuitry 158 is an adjustable gain op amp 167 where the gain is configurable by inputs G0-G2. G0-G2 can be controlled by digital outputs of the microcontroller unit (MCU).

Figure 10:
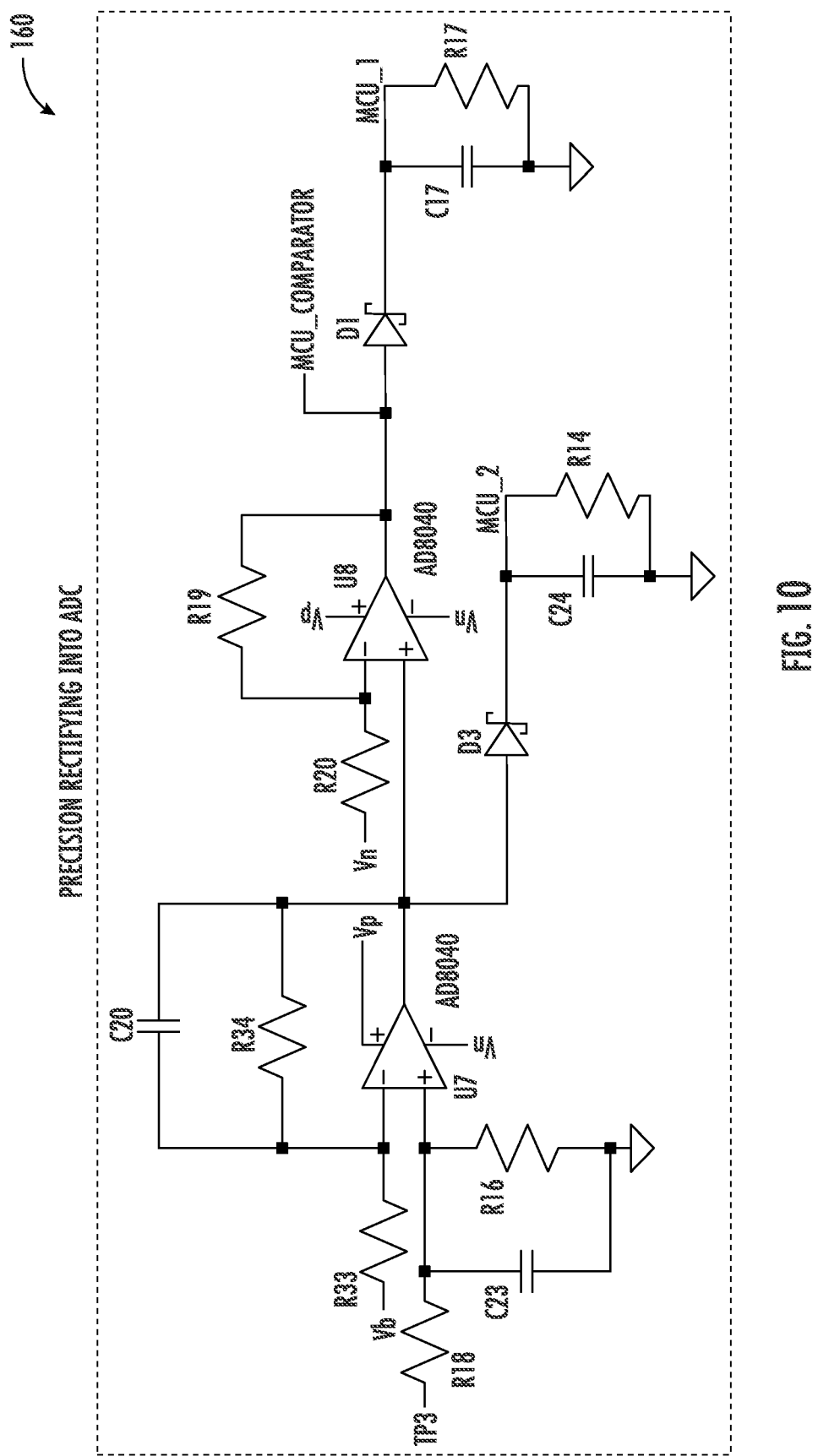
FIG. 10 is a schematic view of electronics of a laser level system, according to an exemplary embodiment.

Referring to FIG. 10, according to an exemplary method of using laser level system 110, the signal generated by detector 40 when receiving the laser beam 22 is processed by amplification circuitry 160. The input to MCU_1 is an amplified input to the MCU for long distance detection. The signal going to MCU_1 is amplified by op-amp U7, which feeds into op-amp U8 to provide further amplification of the signal. As such, op-amp U8 provides higher gain than MCU_2 and provides sufficient amplification to detect faint light beam signals. The input to MCU_2 is amplified by op-amp U7 only. As such, the amplified input to MCU_2 has a lower gain than the input to MCU_1, and provides input to the MCU for short distance detection. Amplification circuitry 160 also provides an input to an MCU comparator used for counting pulses to carry out the aforementioned distance determination between laser level 20 and detector 40 (shown in FIG. 1).

Figure 11:
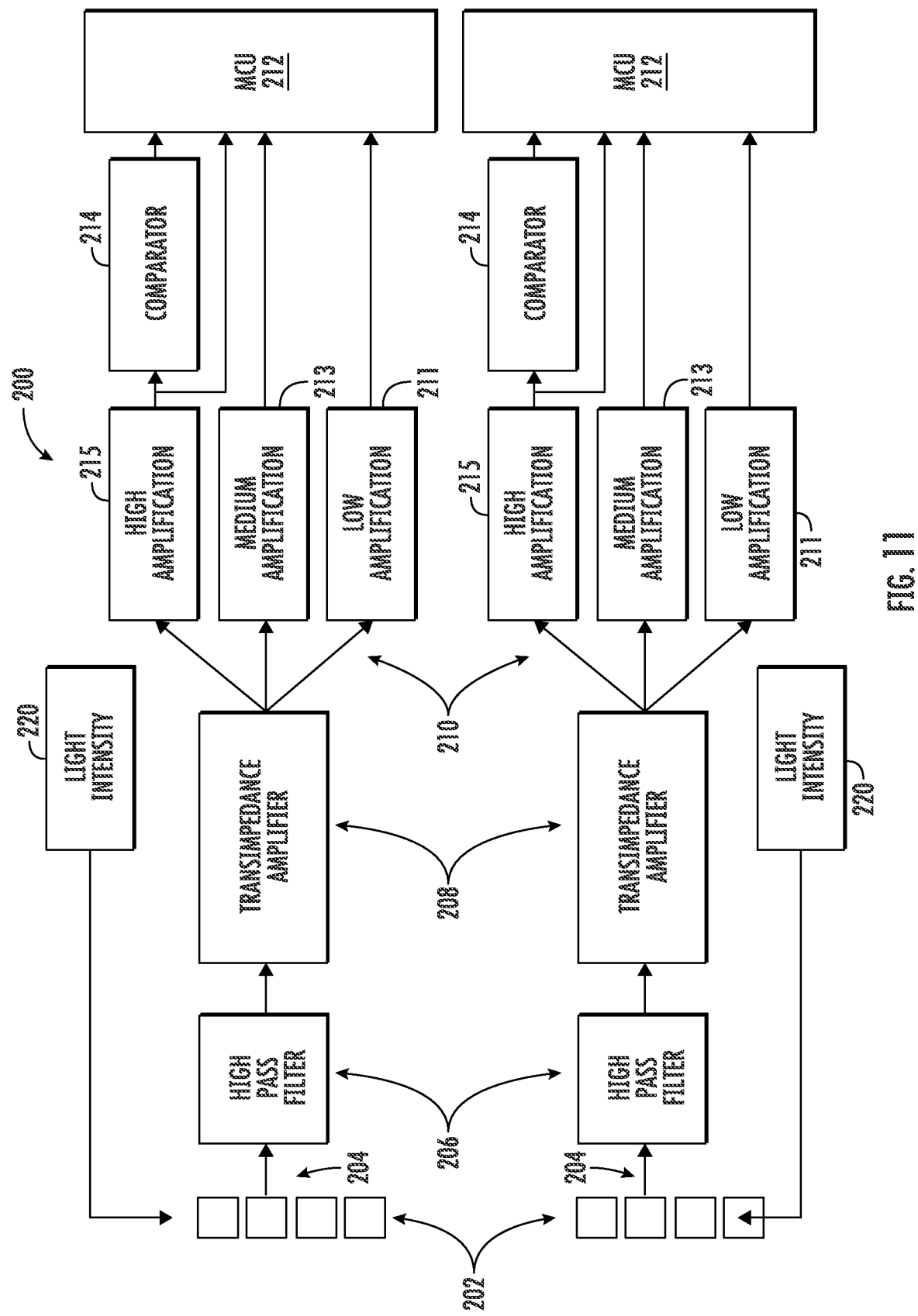
FIG. 11 is a schematic block diagram for a light detecting system having three levels of gain or amplification for the detector signal, in accordance with an exemplary embodiment.

Other embodiments of the detector 40 will provide at least three levels of gain or amplification of the signal from the photodiodes prior to input to the MCU. FIG. 11 provides a schematic block diagram for a system 200 having three levels of gain or amplification for the detector signal. The system 200 includes two photodiode arrays 202. In FIG. 11, the system and circuitry associated with the two photodiode arrays 202 are identical. Therefore, the following description of the system of one photodiode array 202 is applicable to both arrays 202.

The photodiode array 202 has a single output 204 which provides an electric current in response to a light beam incident upon the photodiodes of the array 202. The output 204 goes to a high-pass filter 206 and from there to a transimpedance amplifier 208. The output from the transimpedance amplifier 208 goes to a multi-stage amplifier 210 that includes a low amplification gain amplifier 211, a medium amplification gain amplifier 213, and a high amplification gain amplifier 215, configured to simultaneously and respectively provide a low-amplification stage output, a medium-amplification stage output, and a high-amplification stage output of the signal from the transimpedance amplifier 208. The outputs from the aforementioned three amplifiers 211, 213, 215 of the multi-stage amplifier 210 are input to a microcontroller unit, or MCU 212. It is envisioned that the three amplification stage outputs of both multi-stage amplifier 210 may be input separately into a single MCU 212. The MCU 212 then determines which of the three signals from the multi-stage amplifier 210 to use in order to accurately determine the output from the photodiode array 202. In addition to providing an output signal for input to the MCU 212, the high-amplification stage also provides an output signal to a comparator 214, and the output from the comparator 214 enables the MCU 212 to counts the pulses in the signal to make a distance determination between laser level 20 and detector 40 (shown in FIG. 1).

Figure 12:
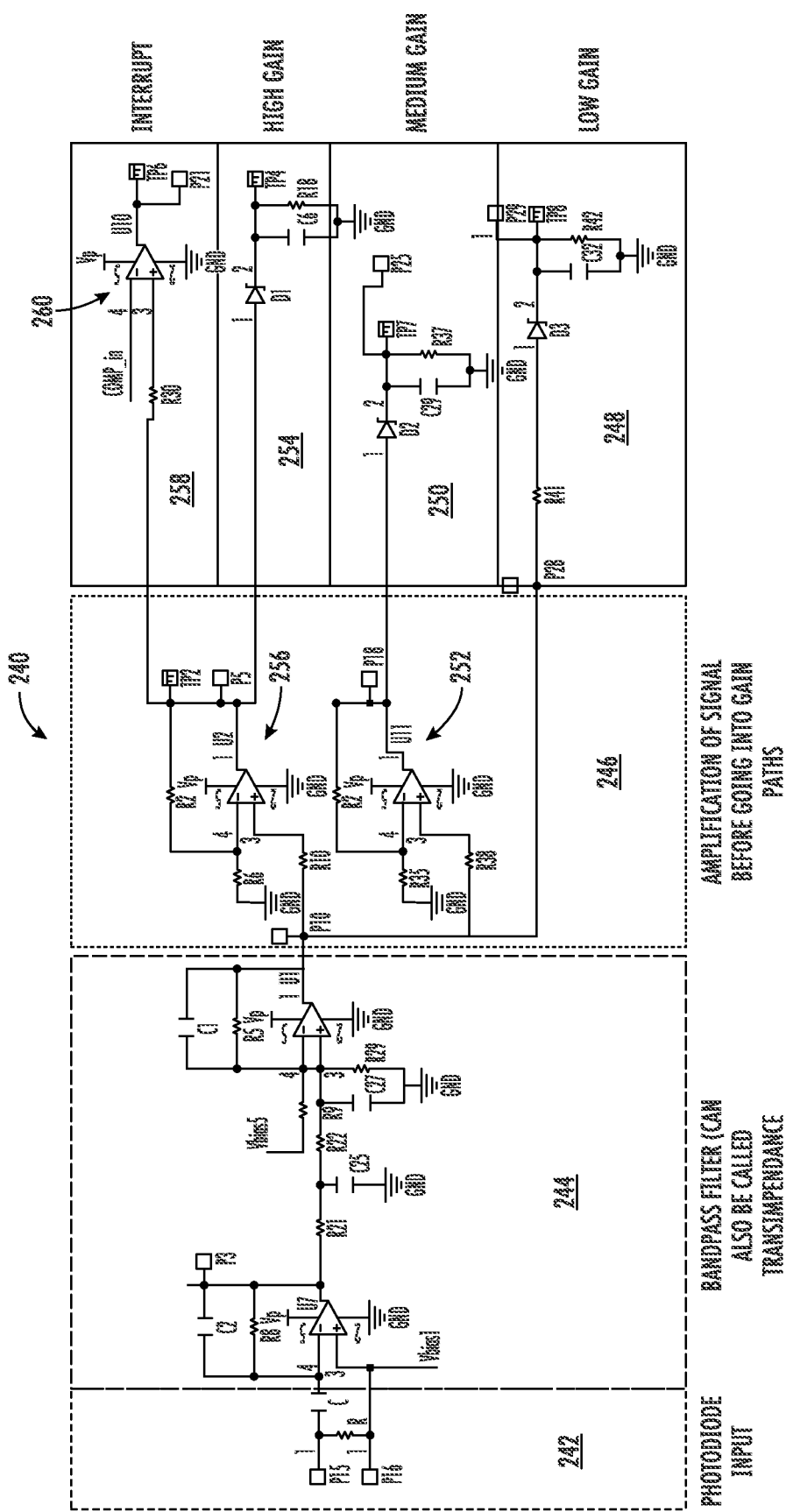
FIG. 12 is a schematic circuit diagram for a system, as shown in FIG. 11, having three levels of gain or amplification for the detector signal, in accordance with an exemplary embodiment.

FIG. 12 is a schematic circuit diagram for a system 240 having three levels of gain or amplification for the detector signal and corresponding to that shown in FIG. 11. However, the system 240 includes only one photodiode array 242 whose output goes to a bandpass filter 244 which includes a transimpedance amplifier. The output of the bandpass filter 244 goes to a multistage amplifier 246 with three gain paths. The low gain path 248 takes the output from the bandpass filter 244 bypassing the amplification stages. The medium gain path 250 takes the output from a first op-amp amplifier 252, which gets its input from the bandpass filter 244. The high gain path 254 takes the output from a second op-amp amplifier 256, which also gets its input from the bandpass filter 244. An interrupt path 258 also takes the output from a second op-amp amplifier 256, and includes a comparator 260 for pulse counting used to make the aforementioned distance determination between laser level 20 and detector 40 (shown in FIG. 1).

Figure 13:
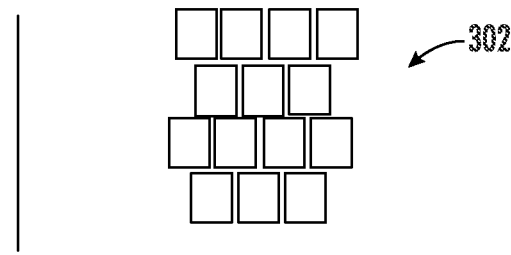
FIG. 13 is a front schematic view of a detector panel, according to an exemplary embodiment.
Figure 14:
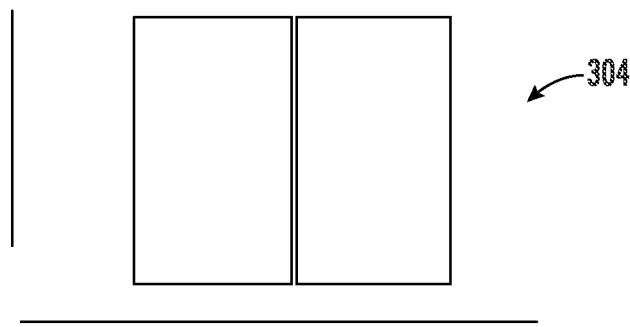
FIG. 14 is a front schematic view of a detector panel, according to an exemplary embodiment.
Figure 15:
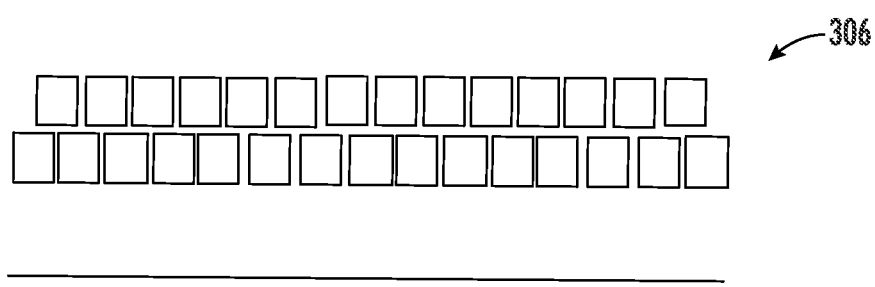
FIG. 15 is a front schematic view of a detector panel, according to an exemplary embodiment.
Figure 16:
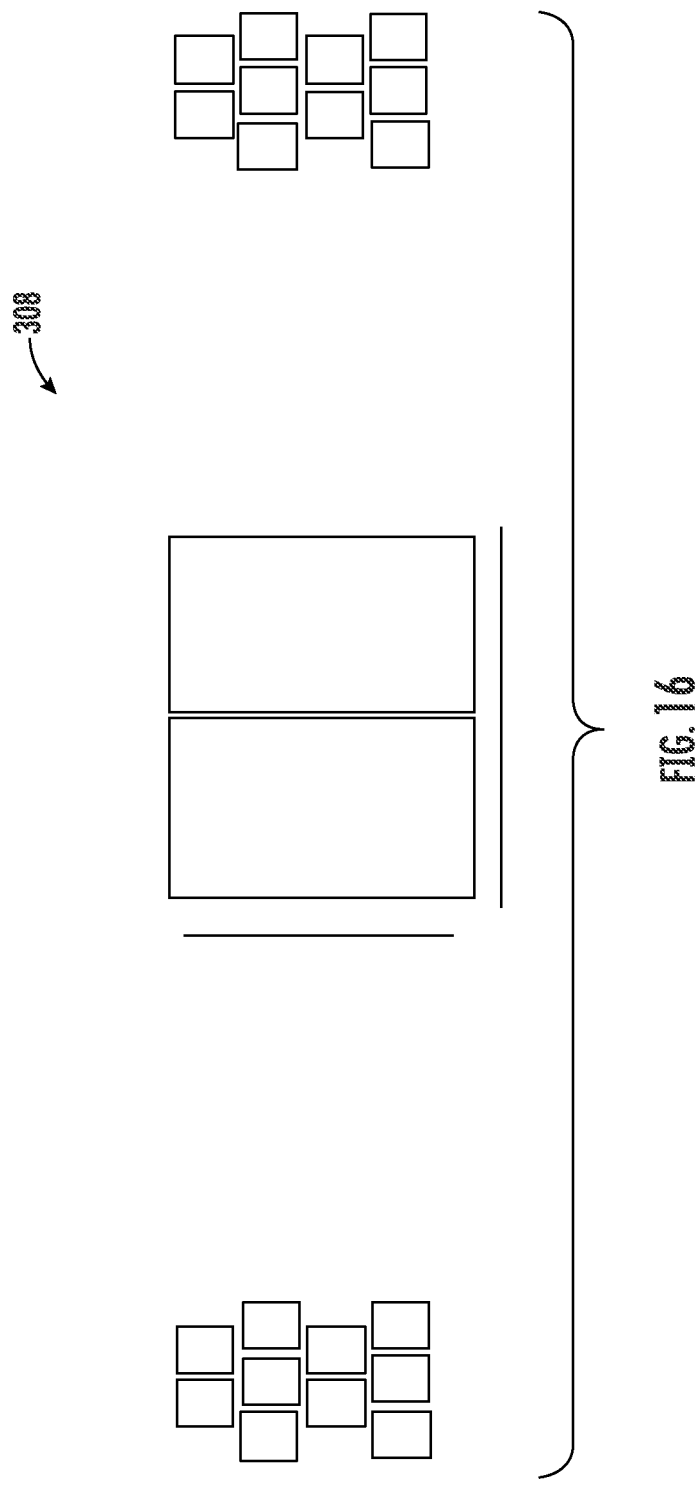
FIG. 16 is a front schematic view of a detector panel, according to an exemplary embodiment.

Referring to FIGS. 13-16, various detector panels are shown according to exemplary embodiments. It is contemplated herein that one or more of the detectors depicted in FIGS. 13-16 can be utilized with one or more of the laser level systems described herein. Referring to FIG. 13, detector panel 302 has a height of 25 mm and a width of 20 mm. Referring to FIG. 14, detector panel 304 has a height of 30 mm and a width of 30 mm. Referring to FIG. 15, detector panel 306 has a width of 60 mm. Referring to FIG. 16, detector panel 308 has a height of 30 mm and the central panel has a width of 30 mm.

Figure 17:
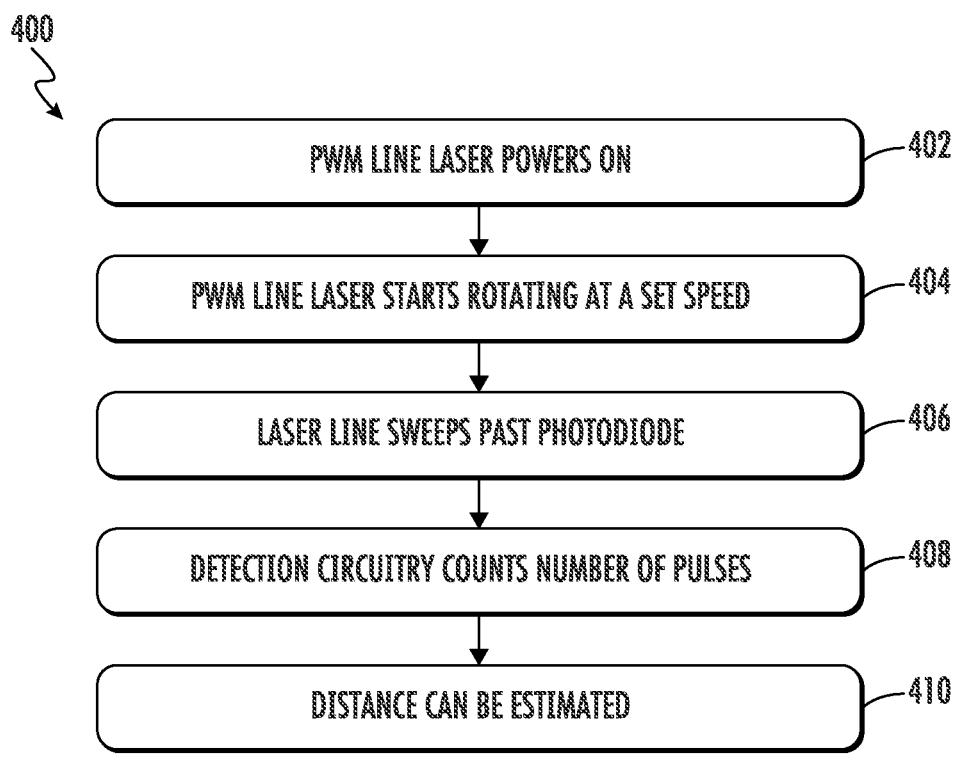
FIG. 17 is a method of calculating distances of a detected laser, according to an exemplary embodiment.

Referring to FIG. 17, an exemplary method 400 of calculating distances between a laser level and a detector is depicted. Starting at step 402, a laser level, such as a PWM line laser, powers on. Then, the PWM line laser starts rotating at a selected speed (step 404). The laser emitted by the PWM line laser sweeps past a light detector, such as a photodiode (step 406), and detection circuitry counts a number of pulses of the laser while the laser was sweeping past the photodiode (step 408). Based on the count of the pulses, the distance between the PWM line laser and the detector can be estimated (step 410). In a specific embodiment, laser level 20 and detector 40, discussed above, are utilized with method 400 to calculate a distance between laser level 20 and detector 40.

Figure 18:
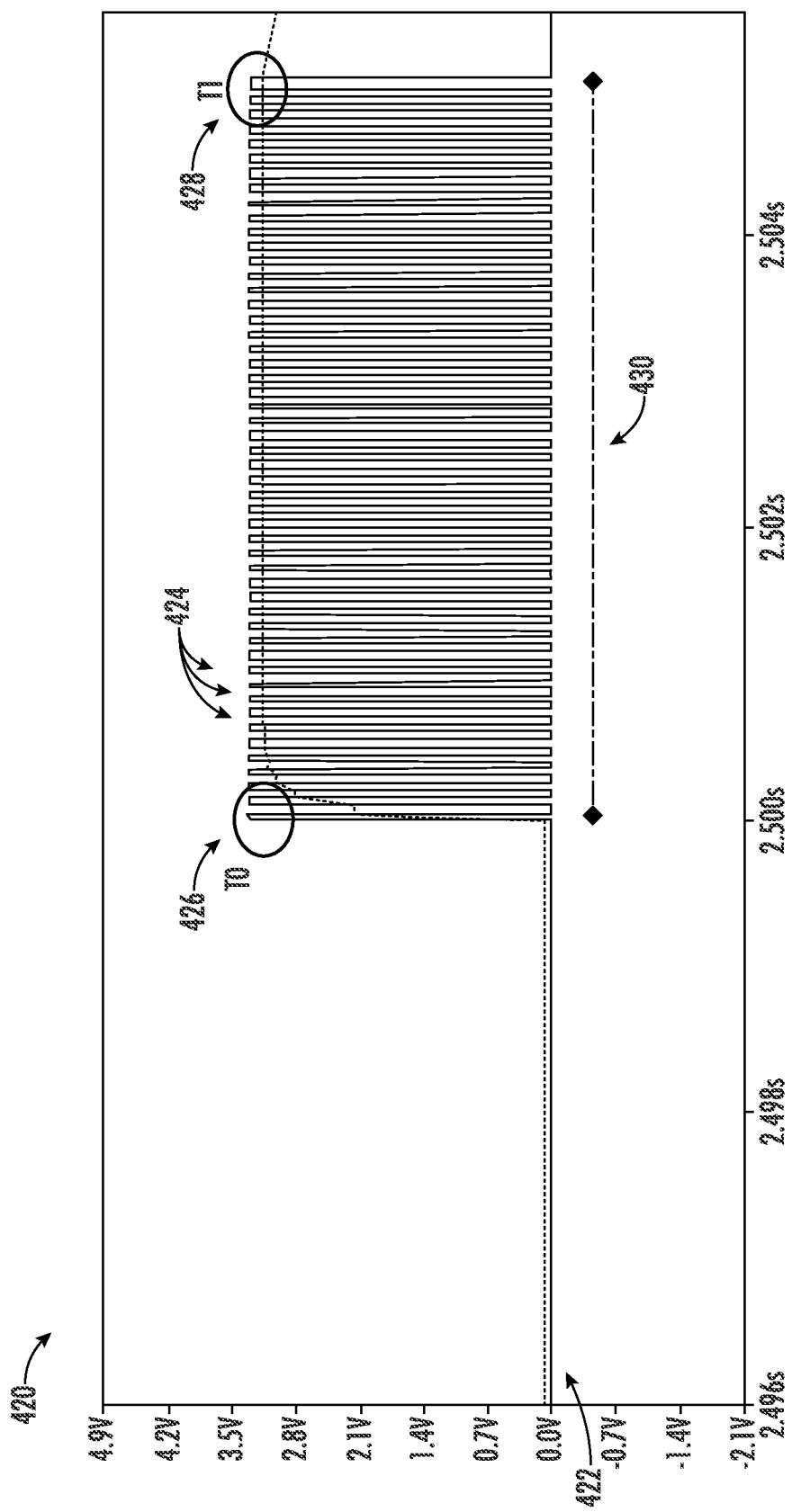
FIG. 18 is a chart of measurements of a detected laser utilized to calculate a distance of the detected laser, according to another exemplary embodiment.

Referring to FIG. 18, a chart 420 of measurements of a laser from a laser level are depicted. When the laser is detected, such as at a photodiode, signal 422 is generated based on the detected laser. In a specific embodiment, signal 422 includes a repeating series of spikes and valleys, shown as pulses 424. The detector notes a first time, shown as Time Zero (T0) 426 that pulse 424 is detected, and a second time, such as a last time, shown as Time One (T1) 428, that pulse 424 is detected. The difference in time between Time Zero 426 and Time One 428, shown as time delta 430, is calculated. The estimated distance between the laser level and the detector is then calculated. In a specific embodiment, the calculation is based on the dimension (e.g., width) of the photodiode, and the known speed the laser is rotating around the laser level.

Figure 19:
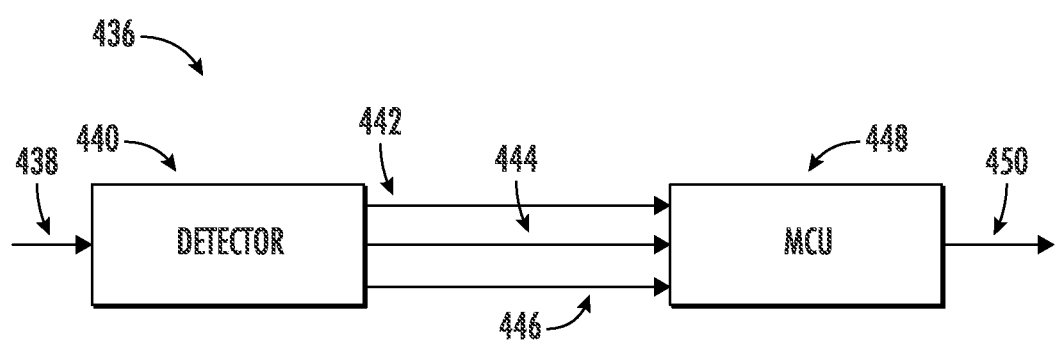
FIG. 19 is a schematic of amplifying the signal from a detected laser, according to another exemplary embodiment.

Referring to FIG. 19, an exemplary system 436 configured to amplify the signal from a detected laser is shown. A laser beam 438 is detected at a detector 440, such as at a photodiode of the detector 440.

Three signals are generated based on the detected signal. First, signal 442 indicates a number of pulses detected. Second, low-gain signal 444 is generated from the detected laser 438. Third, high-gain signal 446 is generated from the detected laser 438. In a specific embodiment, low-gain signal 444 is a first level of amplification of the signal generated by detected laser 438, and high-gain signal 446 is a second level of amplification of the signal generated by detected laser 438, and the second level of amplification is higher than the first level.

In a specific embodiment, the detector 440 generates each of signals 442, 444, and 446 (FIG. 19). In an alternate embodiment, circuitry other than detector 440 generates one or more of signals 442, 444, and 446. In an alternate embodiment, three or more levels of signal amplifications are generated by detector 440 and transmitted to MCU 448. In an alternate embodiment, detector 440 transmits a single signal to MCU 448, and the single signal has an adjustable strength based on the switch settings of an adjustable amplifier, for example.

MCU 448 processes signals 442, 444, and 446 to generate output 450. In a specific embodiment, MCU 448 analyzes signal 442, which indicates the number of pulses detected, to estimate a distance. Based on that analysis, the MCU 448 selects either the low gain signal 444 or the high gain signal 446 as the input signal from which to generate output signal 450. For example, if the number of pulses indicates the detector 440 is below a threshold (e.g., is close to the laser level), MCU 448 selects the low gain signal 444 to generate output signal 450.

Figure 20:
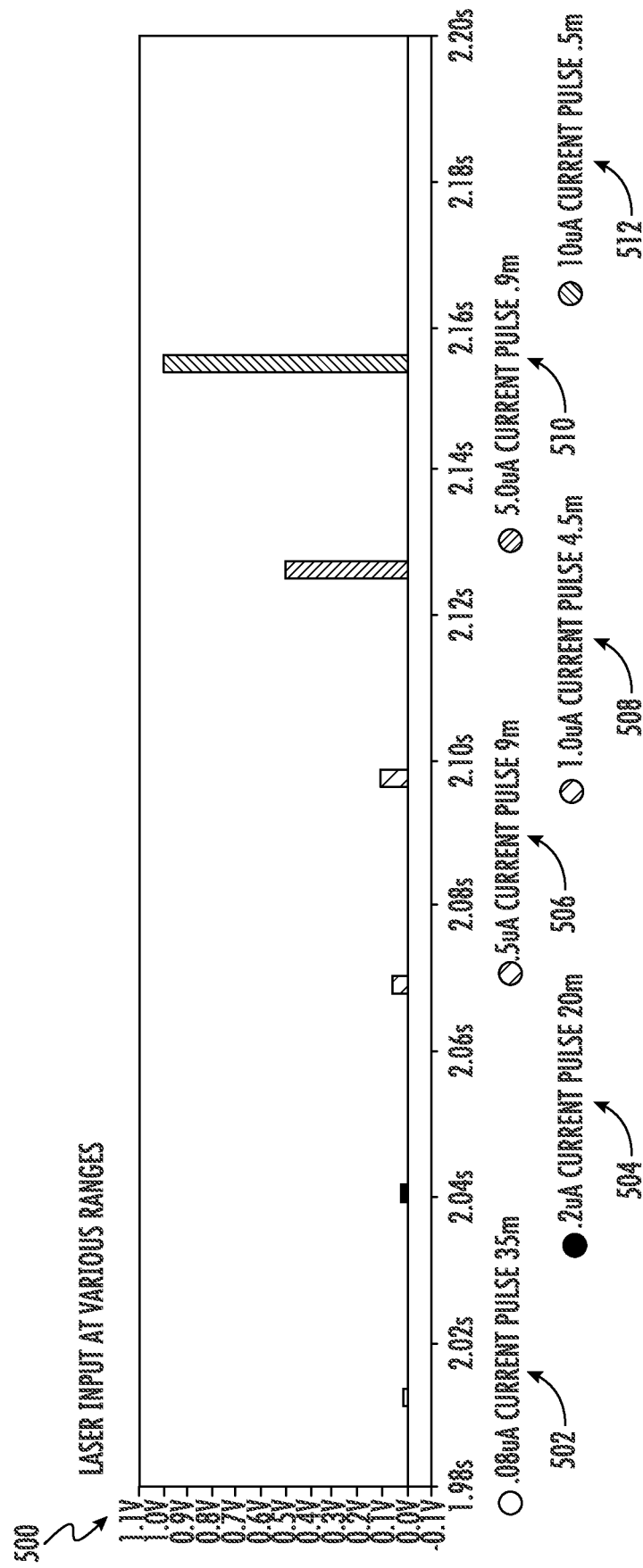
FIG. 20 is a chart of measurements of multiple lasers at multiple distances, according to an exemplary embodiment.
Figure 21:
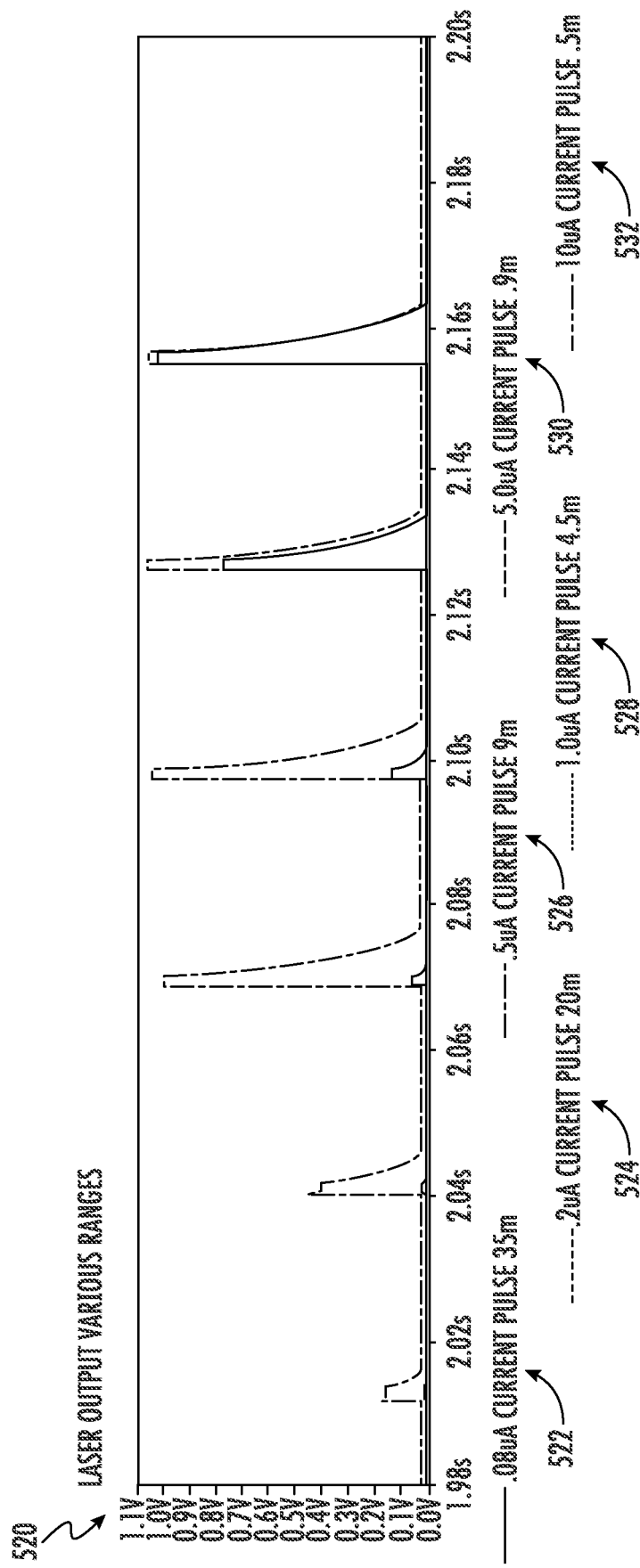
FIG. 21 is a chart of amplified signals of the measurements of multiple lasers at multiple distances of FIG. 18, according to an exemplary embodiment.

Referring to FIGS. 20-21, depicted are various measurements and amplified strengths of multiple lasers at multiple distances. Referring to FIG. 20, chart 500 depicts the strength of signals detected by a laser detector. According to an exemplary embodiment, signal 502 is the strength of a 10 microamperes (µA) current pulse at 0.5 meters, signal 504 is the strength of a 5 µA current pulse at 0.9 meters, signal 506 is the strength of a 1 µA current pulse at 4.5 meters, signal 508 is the strength of a 0.5 µA current pulse at 9 meters, signal 510 is the strength of a 0.2 µA current pulse at 20 meters, and signal 512 is the strength of a 0.08 µA current pulse at 35 meters.

Referring to FIG. 21, chart 520 depicts the strength of laser signals after being amplified. According to an exemplary embodiment, signal 522 is the strength of a 10 µA current pulse at 0.5 meters, signal 524 is the strength of a 5 µA current pulse at 0.9 meters, signal 526 is the strength of a 1 µA current pulse at 4.5 meters, signal 528 is the strength of a 0.5 µA current pulse at 9 meters, signal 530 is the strength of a 0.2 µA current pulse at 20 meters, and signal 532 is the strength of a 0.08 µA current pulse at 35 meters.

Figure 22:
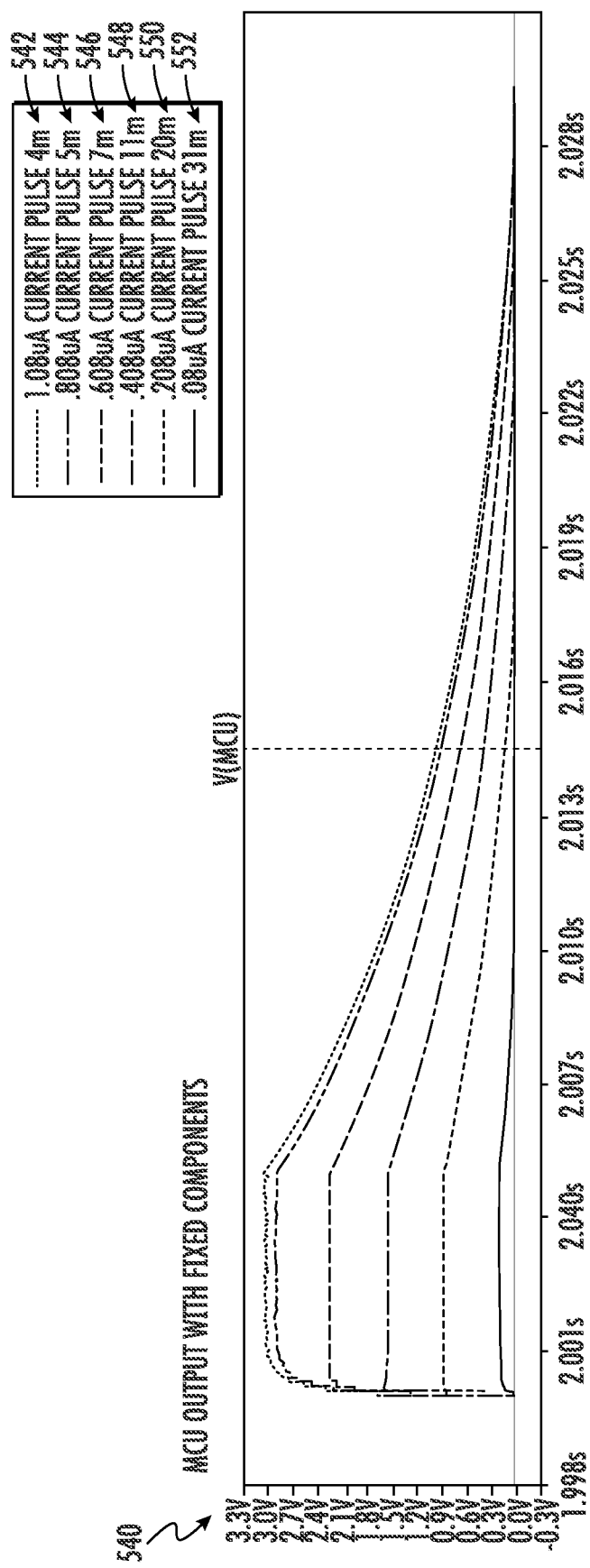
FIG. 22 is a chart of output from an MCE of measurements of multiple lasers at multiple distances, according to an exemplary embodiment.
Figure 23:
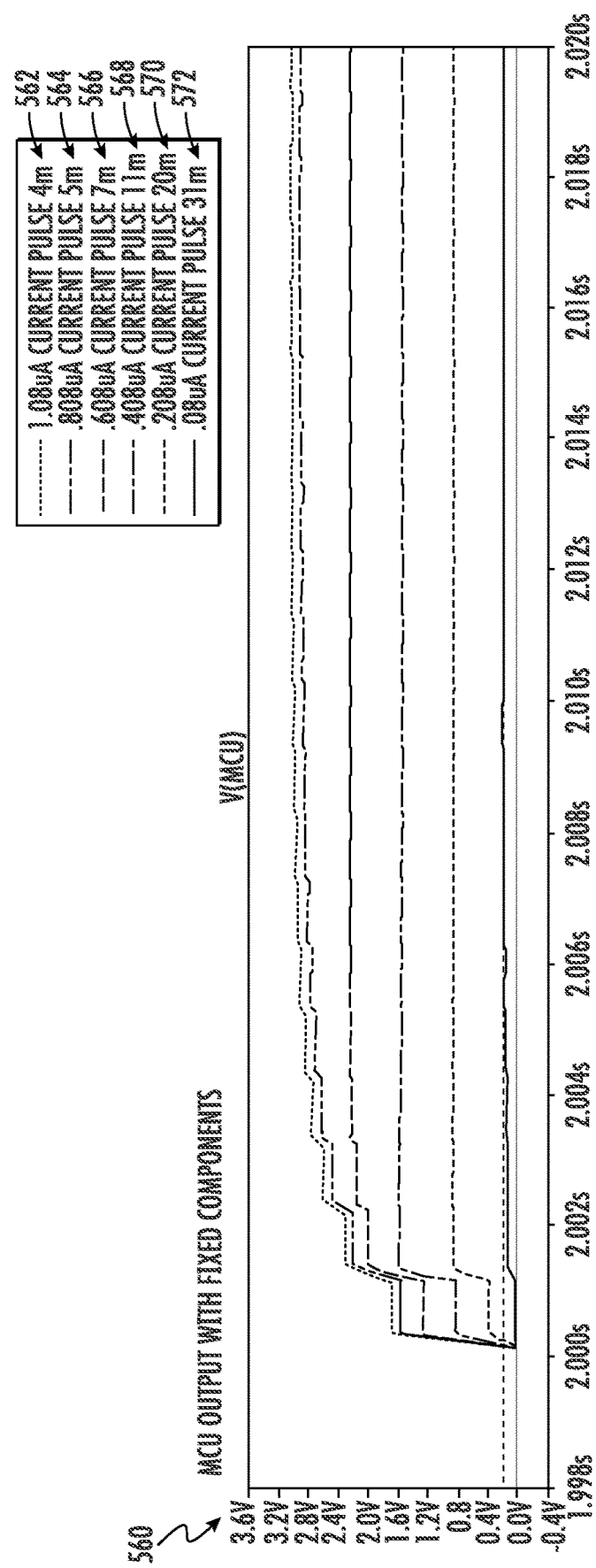
FIG. 23 is a chart of output from an MCE of measurements of the multiple lasers at multiple distances of FIG. 20, according to an exemplary embodiment.

Referring to FIGS. 22-23, depicted are various measurements and amplified strengths of multiple lasers at multiple distances. Referring to FIG. 22, chart 540 depicts the strength of signals output by an MCU. According to an exemplary embodiment, signal 542 is the strength of a 1.08 µA current pulse at 4 meters, signal 544 is the strength of a 0.808 µA current pulse at 5 meters, signal 446 is the strength of a 0.608 µA current pulse at 7 meters, signal 548 is the strength of a 0.408 µA current pulse at 11 meters, signal 550 is the strength of a 0.208 µA current pulse at 20 meters, and signal 552 is the strength of a 0.08 µA current pulse at 31 meters.

Referring to FIG. 23, chart 560 depicts the strength of signals output by an MCU. According to an exemplary embodiment, signal 562 is the strength of a 1.08 µA current pulse at 4 meters, signal 564 is the strength of a 0.808 µA current pulse at 5 meters, signal 566 is the strength of a 0.608 µA current pulse at 7 meters, signal 568 is the strength of a 0.408 µA current pulse at 11 meters, signal 570 is the strength of a 0.208 µA current pulse at 20 meters, and signal 572 is the strength of a 0.08 µA current pulse at 31 meters.

Figure 24A:
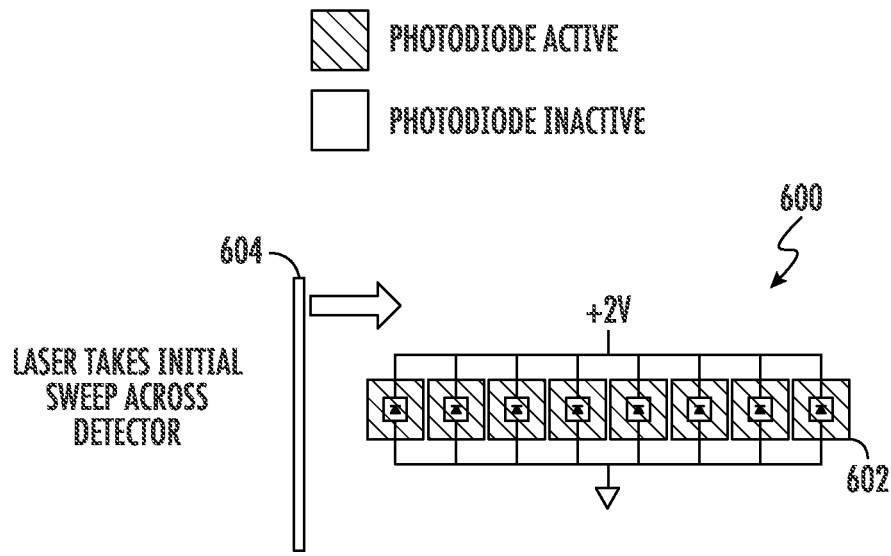
FIGS. 24A-24C show schematic representations of a photodiode array which are used to demonstrate a process for the automatic alignment of the laser level, according to an exemplary embodiment.
Figure 24B:
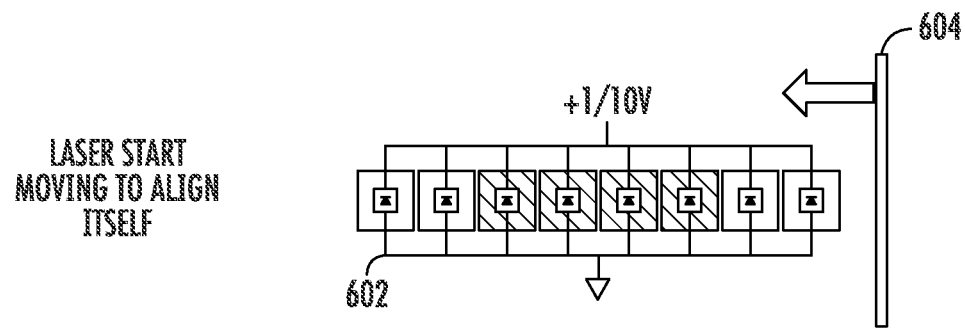
Figure 24C:
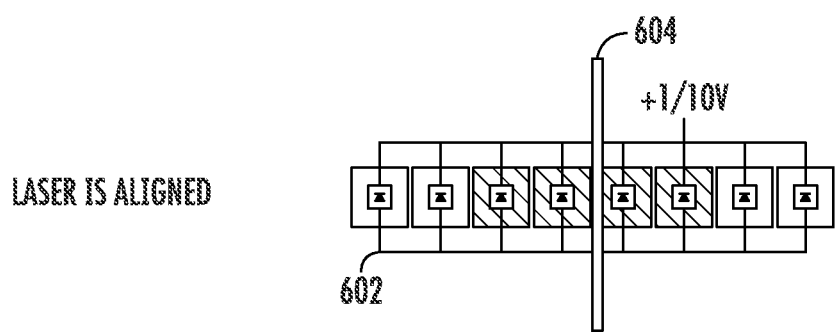

FIGS. 24A-24C show schematic representations of a photodiode array 600 which are used to demonstrate a process for the automatic alignment of the laser, in accordance with an embodiment of the invention. FIG. 24A shows the photodiode array 600 with eight photodiodes 602 positioned side-by-side with all eight photodiodes 602 strongly reversed biased in order to improve the response time of the photodiodes 602. In this context, "strongly reverse biased" is a reverse bias of approximately two volts, though in alternate embodiments the reverse bias could be greater or less than two volts. In certain other embodiments, the strong reverse bias is 20 volts or more. A laser beam 604 sweeps across the eight reversed biased photodiodes 602. As shown in FIG. 24A, the laser beam 604, when incident on the photodiodes 602, may be a vertical planar laser beam 22 (shown in FIG. 4) which extends vertically both above and below the photodiode array 600 during the entirety of the sweep.

During the course of this first sweep of the laser beam 604, the detector 40 (shown in FIGS. 1-4) determines the distance between the laser level 20 and the detector 40, for example using the pulse-counting method described above. As indicated above, the strongly reversed biased photodiodes 602 respond quickly to the laser sweep allowing for a fast initial determination of the distance between the laser level 20 and the detector 40. After determination of the distance between the laser level 20 and the detector 40, the MCU determines the best gain amplification to use at that distance.

Following the first laser sweep, the two photodiodes 602 on each end of the photodiode array 600 are turned off or deactivated. In an alternate embodiment, only one photodiode 602 at each end of the photodiode array 600 is deactivated. FIG. 24B shows the photodiode array 600 with the four center photodiodes 602 operating and the four outer photodiodes 602 turned off. The four operating center photodiodes 602 are lightly reversed biased. In this context, "lightly reverse biased" is a reverse bias of less than three tenths of a volt, or in more particular embodiments, approximately one tenth of a volt, though in alternate embodiments the reverse bias could be slightly greater or slightly less than one tenth of a volt. In certain other embodiments, the light reverse bias is less than two volts. While reducing the reverse bias will slow the response time of the four operating center photodiodes 602, the accuracy of the readings is increased.

As shown in FIG. 24B, from where the first laser sweep ended, the laser beam 604 performs a second sweep in the opposite direction. As the laser beam 604 moves toward the center of the photodiode array 600, measurements are taken of the current flow from each end of the photodiode array 600. FIG. 24C shows the laser beam 604 aligned at the point on the photodiode array 600 where the current flow from each end of the photodiode array 600 is equal. As can be seen from FIG. 24C, the point of alignment may not be exactly at the center of the photodiode array 600 though that point would be expected to be somewhat close to the center.

In particular embodiments, the detector 40 transmits a signal, via wired or wireless means, to the laser level 20 that indicates when the current flow from one end of the photodiode array 600 is equal to the current flow from the other end of the array 600. In certain embodiments, the photodiode array 600 has an even number of photodiodes, and the current flow from one end of the photodiode array 600 is from one half of the photodiodes in the array 600, while the current flow from the other end of the array 600 is from the other, or remaining, half of the photodiodes in the array 600. In embodiments, the detector 40 would only transmit the signal for non-zero current flows above a certain threshold, such that the signal would only be triggered when a laser light is incident upon the photodiode array 600.

Figure 25:
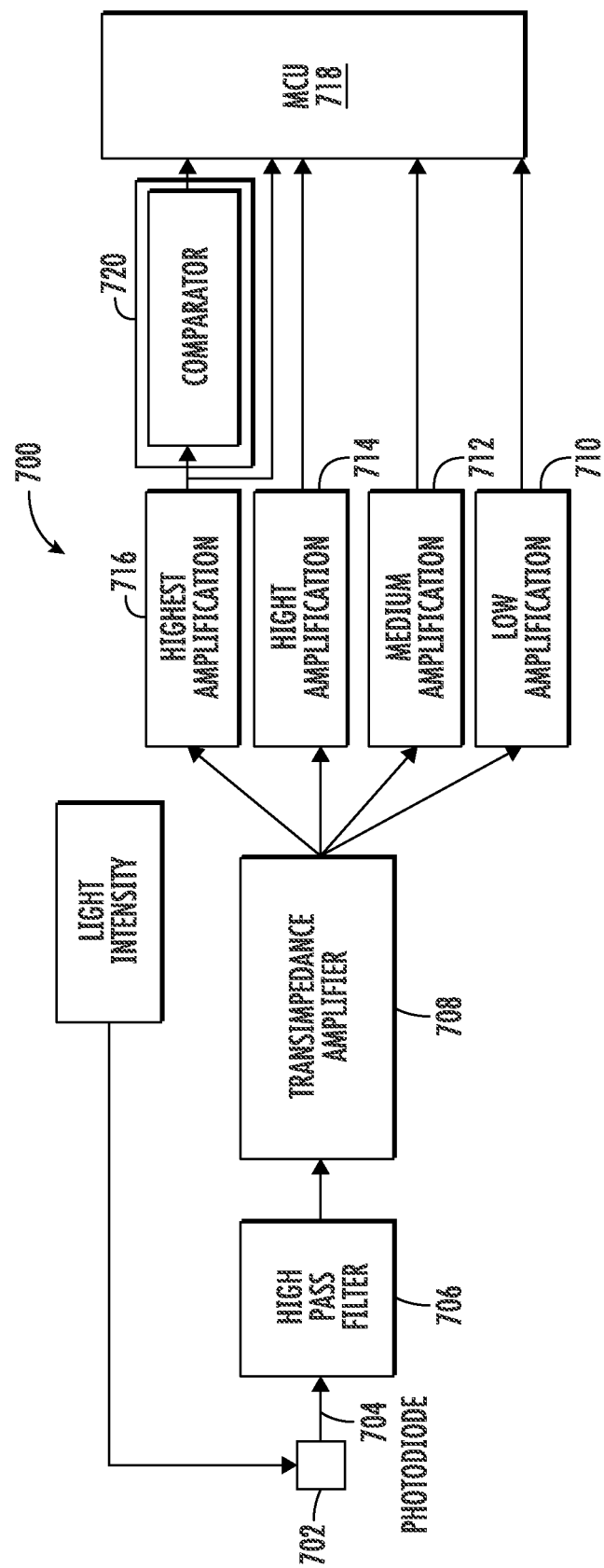
FIG. 25 is a schematic block diagram for a light detecting system having four levels of gain or amplification for the detector signal, according to an exemplary embodiment.

FIG. 25 is a schematic block diagram for a light detecting system 700 having four levels of gain or amplification for the detector signal, in accordance with an exemplary embodiment. The light detecting system 700 includes one photodiode 702. In a typical application, the photodiode 702 is reverse biased during use. The single photodiode 702 is used in combination with a Fresnel lens 750 having a negative focal length (shown in FIG. 26).

The photodiode 702 has a single output 704 which provides an electric current in response to a light beam incident upon the photodiode 702 via the negative-focal-length Fresnel lens 750. The signal from output 704 goes to a high-pass filter 706 and from there to a transimpedance amplifier 708. The output from the transimpedance amplifier 708 is simultaneously routed to four different amplification stages each with a corresponding output. The four amplification stages include a low-gain amplifier 710, a medium-gain amplifier 712, a high-gain amplifier 714, and a very-high-gain amplifier 716. The outputs from the four amplifiers 710-716 are input to an MCU 718. It is envisioned that the four amplifier outputs are input separately into a single MCU 718. The MCU 718 then determines which of the four signals from the four amplifiers 710-716 to use in order to most accurately determine the output from the photodiode 702. In certain embodiments, the signal determined by the MCU 718 to be the most accurate from among the four available outputs is provided to the user via a display on the detector 40, or on the laser level 20, or on some other suitable device for viewing such information.

FIG. 25 also shows that the light detecting system 700 may include an optional comparator 720, which counts the pulses in the signal to make a distance determination between laser level 20 and detector 40 (shown in FIG. 1). However, as referenced, the system 700 can operate without the comparator 720 in which case the MCU 718 is configured to choose the best signal among the four amplifier outputs absent any distance determination. The MCU 718 may determine which of the four signals is to be used based on characteristics such as signal strength, signal-to-noise ratio, etc.

Constructing the light detection system 700 with a single photodiode 702 and Fresnel lens 750, which can be made from plastic, results in a system that is easier to manufacture, less expensive to manufacture, and easier to calibrate. In an exemplary embodiment, a light detector incorporates the single photodiode 702 positioned on the detector to detect light from a laser. A negative focal length Fresnel lens 750 is positioned above the photodiode 702 to effectively create a window in the detector such that laser light must pass through the negative focal length Fresnel lens 750 window before reaching the single photodiode 702.

Figure 26:
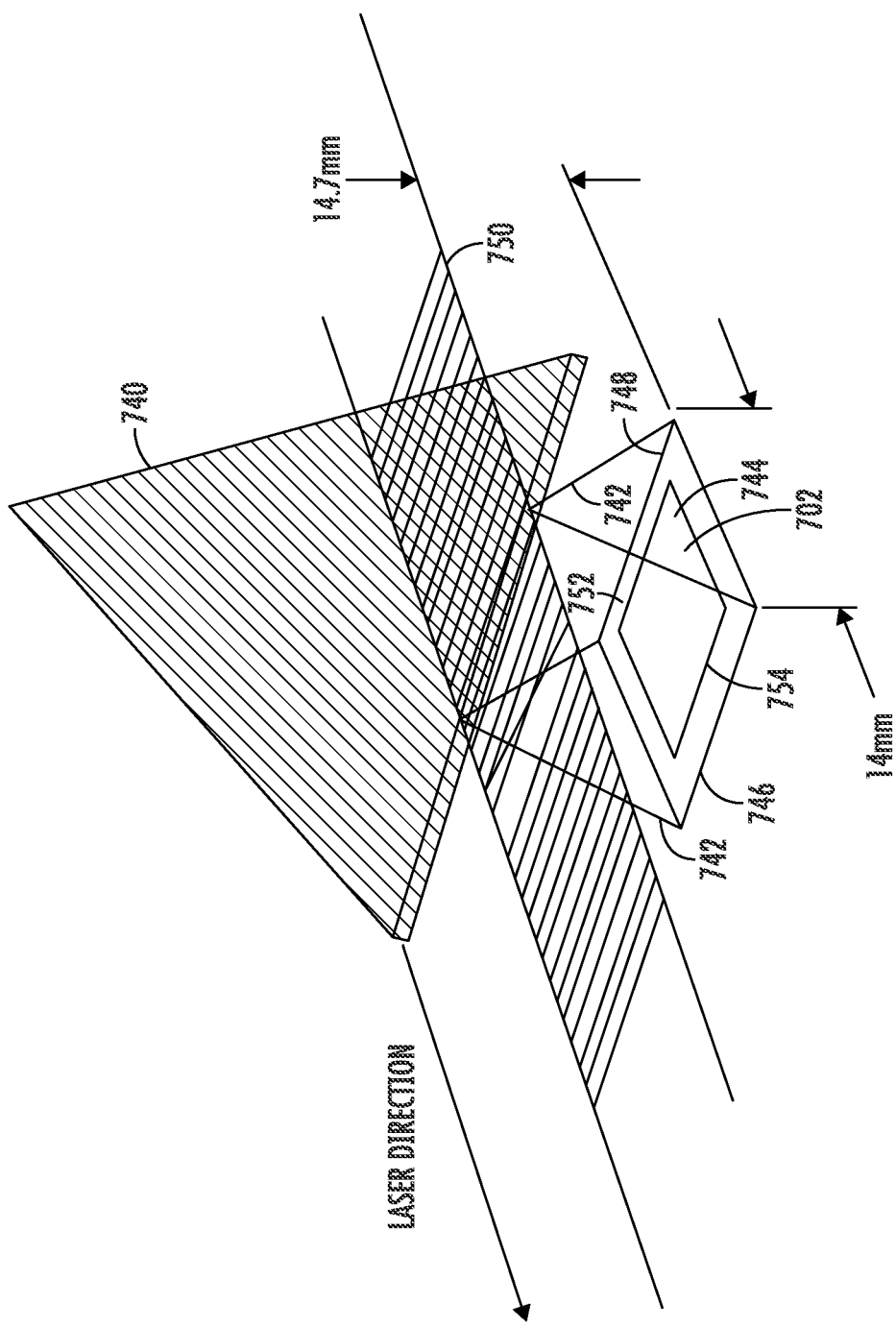
FIG. 26 is a schematic diagram showing a laser beam directed at the single photodiode and Fresnel lens, according to an exemplary embodiment.
Figure 27:
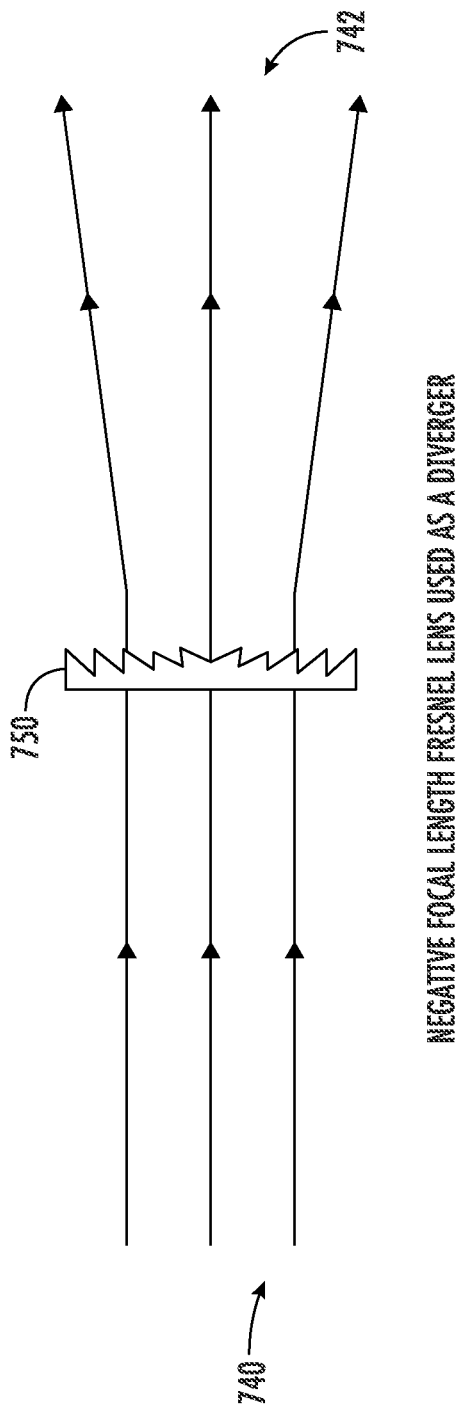
FIG. 27 is a schematic diagram illustrating a negative focal length Fresnel lens of the type incorporated in an exemplary embodiment.

FIG. 26 is a schematic diagram showing a laser beam 740 directed at the single photodiode 702 and Fresnel lens 750, in accordance with an embodiment of the invention, while FIG. 27 is a schematic diagram illustrating a negative focal length Fresnel lens 750 of the type incorporated in embodiment of the invention. As illustrated by FIG. 27, the Fresnel lens 750 spreads out the laser beam 740. FIG. 26 shows a spread-out light beam 742 incident on the photodiode 702. The spread-out light beam 742 must be larger than the photodiode 702 when the spread-out light beam 742 is incident on the photodiode 702.

In one particular exemplary embodiment, the photodiode 702 is a square-shaped, and the Fresnel lens 750 is positioned between 12 and 18 millimeters from the photodiode 702. In a more particular embodiment, the Fresnel lens 750 is positioned approximately 14.7 millimeters above the photodiode 702. The negative focal length of the Fresnel lens 750 is such that the spread-out light beam 742 has a square footprint 744 where each side of the footprint is between 12 and 16 millimeters long. In a specific embodiment, the spread-out light beam 742 has a square footprint 744 where each side of the footprint is approximately 14 millimeters in length. In the exemplary embodiment of FIG. 26, the square photodiode 702 has sides that are approximately 12 millimeters in length, though it is envisioned that the photodiode 702 may have sides with lengths greater or lesser than 12 millimeters, and that the photodiode 702 may be rectangular with two sets of opposed sides having different lengths. It is understood that alternate embodiments of the invention may have dimensions for the photodiode 702, the footprint 744, and distance from photodiode 702 to Fresnel lens 750 that are substantially different from those recited above.

The spread-out light beam 742 created by the Fresnel lens 750 accentuates the Gaussian distribution of the laser light so that as the laser beam 740 passes over the Fresnel lens 750 and photodiode 702, the photodiode 702 can detect a rise and then fall of light intensity. After the first pass, the maximum intensity is noted and used to set the sensitivity of the photodiode 702 for the second pass. Then, once the photodiode 702 detects the maximum level of light during the second pass, the system 700 determines that the laser beam 740 is centered on the photodiode 702.

Figure 28:
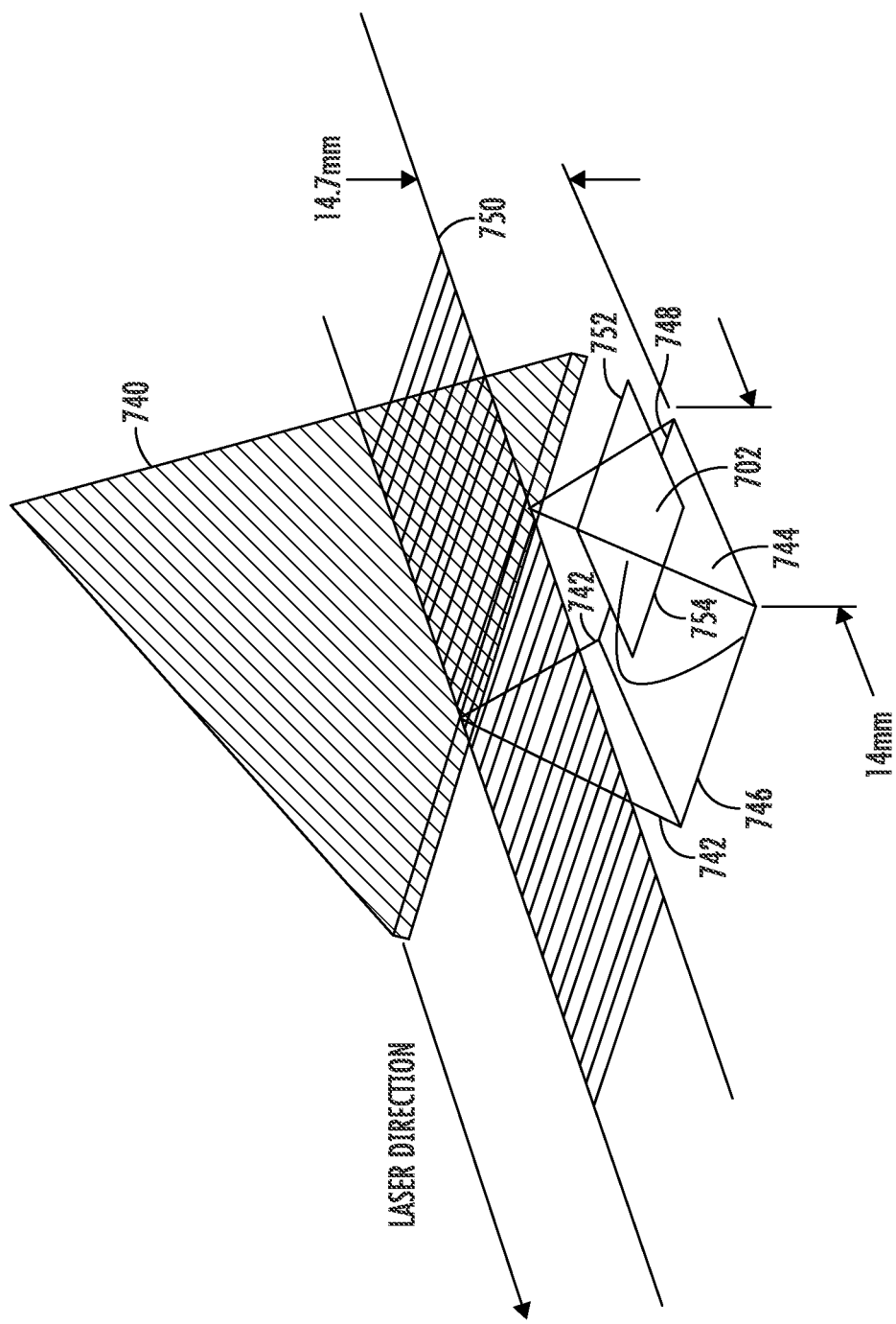
FIG. 28 is a schematic diagram showing the laser beam of FIG. 26 directed at a different portion of the single photodiode, according to an exemplary embodiment.

FIG. 26 illustrates that positioning of the square footprint 744 over the photodiode 702 such that the output from the photodiode 702 is at maximum intensity FIG. 28 shows the positioning of the square footprint 744 only partially over the photodiode 702 such that the output from the photodiode 702 is well below the maximum intensity. In this way, it can be seen how rotation of the laser beam 740 would cause a leading edge 746 of the square footprint 744 produced by the spread-out light beam 742 to come into contact with a first edge 752 of the photodiode 702. The output from the photodiode 702 is very low at this point, but increases until the positioning of the square footprint 744 over the photodiode 702 is positioned as shown in FIG. 26 where the photodiode output is at a maximum after which the output intensity decreases until a trailing edge 748 moves past a second edge 754 of the photodiode 702. Thus, it can be seen how the photodiode 702 output produces a Gaussian curve in response to a rotating laser beam 740.

Figure 29:
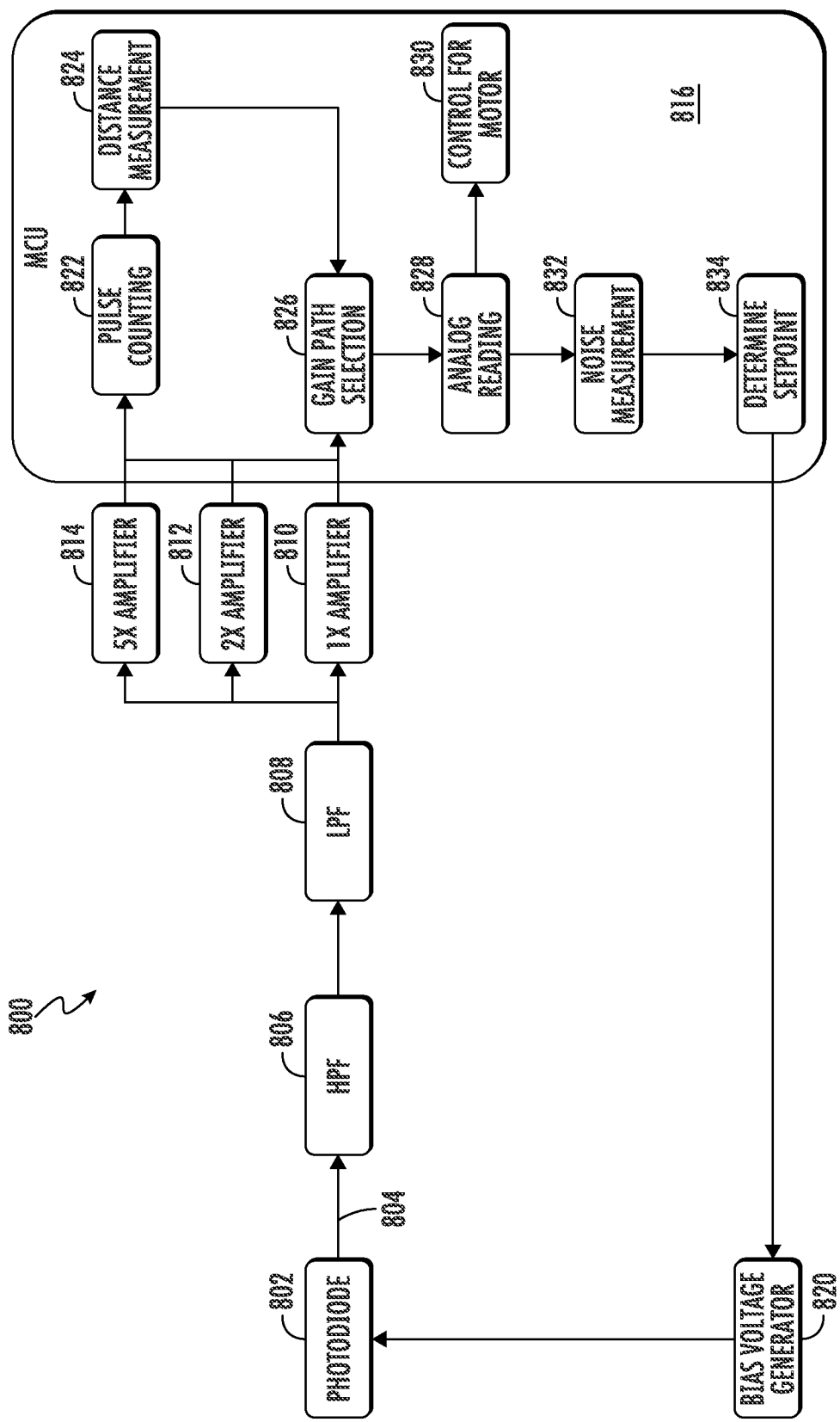
FIG. 29 is a schematic block diagram for a light detecting system having a feedback loop for photodiode bias control, according to an exemplary embodiment.

An alternate embodiment of the light detecting system is shown in FIG. 29 which provides a schematic block diagram for a light detecting system 800 having a feedback loop for photodiode bias control, in accordance with an exemplary embodiment. The feedback loop of light detecting system 800 is provided by a bias voltage generator 820 which receives an input from an MCU 816 and, based on the input signal from the MCU 816, outputs a variable bias voltage to the photodiode 802. The feedback loop is a method to reduce signal noise by determining a noise level in the signal from the photodiode 802, and then adjusting the amount of reverse bias voltage being applied to the photodiode 802. The reverse bias voltage is set at the level most appropriate for the distance that the laser is from the receiver and the level of signal noise in the photodiode output.

The light detecting system 800 has three levels of gain or amplification for the detector signal. The system 800 includes at least one photodiode 802. The photodiode array 802 has a single output 804 which provides an electric current in response to a light beam incident upon the photodiode 802. The output 804 goes to a high-pass filter 806 and from there to a low-pass filter 808. The output from the low-pass filter 808 goes to three different amplification stages: a low-gain amplifier 810, a medium-gain amplifier 812, and a high-gain amplifier 814. The outputs from the three amplifiers 810-814 are input to an MCU 816. It is envisioned that the three amplifier outputs are input separately into a single MCU 816. The MCU 816 then determines which of the three signals from the three amplifiers 810-814 to use in order to accurately determine the output from the photodiode 802.

In the embodiment of FIG. 29, the MCU 816 includes a pulse counting module 822 used to approximate a distance between the laser level 20 and the detector 40 (see FIG. 1). A module 824 to output the distance measurement provides an input signal to a gain path selection module 826 which also gets an input from the three amplifiers 810-814. The gain path selection module 826 output goes to an analog reading module 828, which provides an output to a motor control module 830, which provides a wired or wireless signal to control the motor which rotates the laser level 20. An output of the analog reading module 828 is also provided as an input to a noise measurement module 832. The noise measurement module 832 provides an output to a bias setpoint module 834 whose output goes to the input of the bias voltage generator 820.

In a typical application of the light detecting system 800, the photodiode 802 begins with a nominal reverse bias, such as 20 volts, but could be significantly higher or lower than 20 volts depending on the hardware and application. In some cases, a reverse bias of 20 volts results in noise that distorts the photodiode 802 signal output, which, in turn, can make proper alignment of the laser difficult. A pulsing laser beam is swept across the photodiode 802. A typical pulsing frequency of the laser beam is about 10 kilohertz but may be greater or less than 10 kilohertz. Pulse counting is done by pulse counting module 822 to determine an approximate distance from the laser to the detector. A gain path is selected by gain path selection module 826, then a maximum analog reading for the output of the photodiode 802 is saved by analog reading module 828. The laser beam then sweeps back across the photodiode 802 to align at the point of maximum intensity for photodiode output. The signal-to-noise ratio is determined by noise measurement module 832. Additionally, the MCU 816 calculates a net equivalent power in the frequency domain, and based on the signal-to-noise ratio and net equivalent power, the bias setpoint module 834 determines a bias voltage setpoint which is provided to the bias voltage generator 820.

When the signal-to-noise ratio is within a certain range, adjusting the bias voltage on the photodiode 802 reduces signal noise. Those factors which may influence the level of bias voltage adjustment include the level of ambient light, and the distance between the laser and detector.

Figure 30:
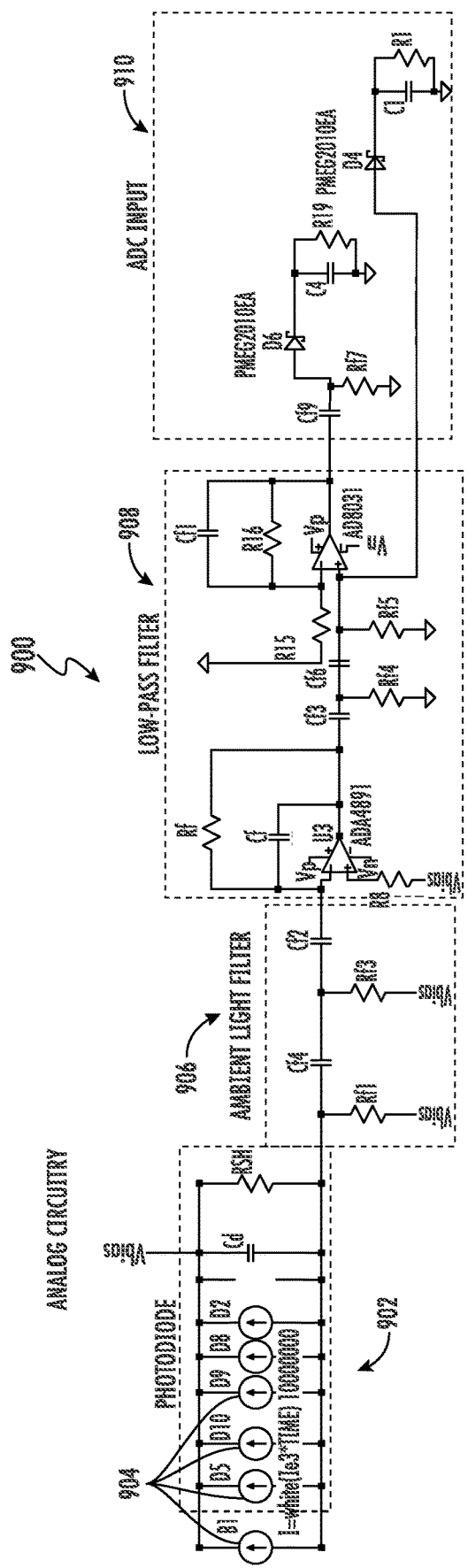
FIG. 30 is a schematic circuit diagram showing the analog circuitry used in a laser light detection system, according to an exemplary embodiment.

FIG. 30 is a schematic circuit diagram showing the analog circuitry 900 used in a laser light detection system. The analog circuitry 900 includes a plurality of photodiodes 902 where the laser light pulses from the laser level are represented as a plurality of parallel current sources 904. The laser light pulses cause the photodiodes 902 to generate current pulses which are directed to an ambient light filter 906, and then through a low-pass filter 908 with some amplification before going into an analog-to-digital converter 910.

By changing the duty cycle of the laser pulses, we can reduce the noise seen by the detector. A higher duty cycle is more easily seen by the naked eye because the laser is on for more time than it is off, and, intuitively, one would think that a higher duty cycle would be more easily detected because more power is being transmitted. However, a lower duty cycle reduces the noise seen by the detector because the short, sharp pulses are more distinct from ambient light. One additional benefit of using a lower duty cycle is that we need one fewer op amps since we do not need to invert the signal (using a high duty cycle, we do need to invert the signal).

Embodiments of the invention disclosed herein take advantage of this by keeping the duty cycle high during "normal" operation where a user will want to see the laser line. However, during the automatic alignment function, the user does not need to watch the laser, so we can change the duty cycle to low. Essentially, when the user initiates the automatic alignment function, the duty cycle is reduced and the visibility of the laser light is reduced accordingly, possibly to the point, in some instances, that the laser light is not visible to the user. Then, once the automatic alignment process is complete, the laser duty cycle is changed back to high such that the light. From the viewpoint of the user, the laser turns off (i.e., is not visible) and then turns back on and is exactly aligned with the detector.

Figure 31:
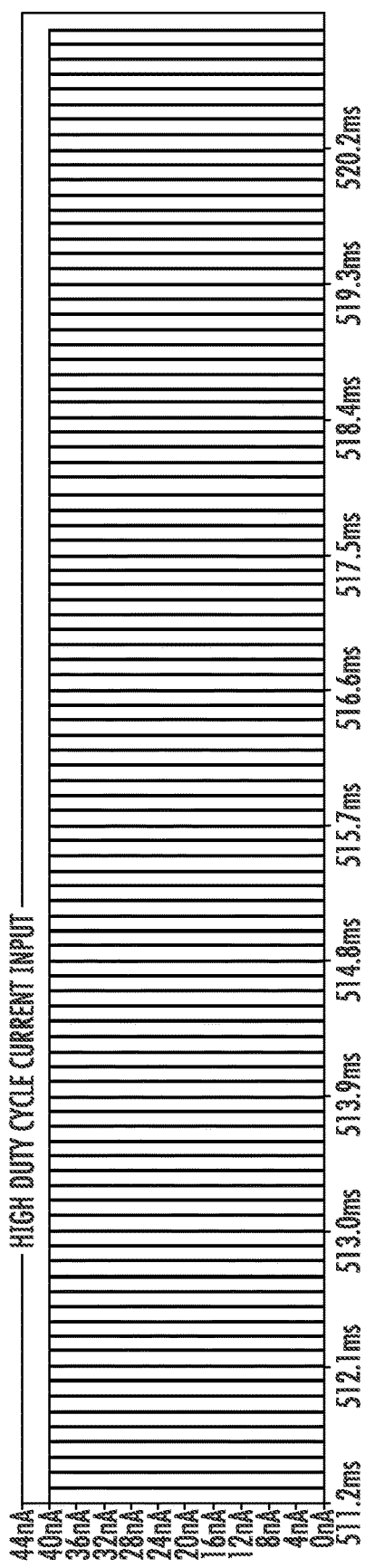
FIG. 31 is a graphical illustration showing an example of a high duty cycle current input for a laser detection system.
Figure 32:
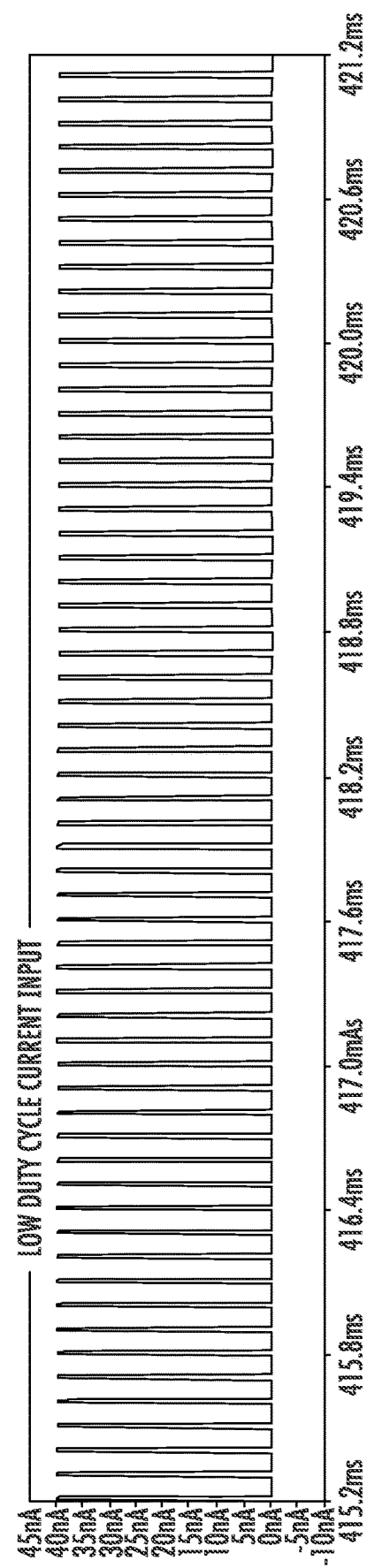
FIG. 32 is a graphical illustration showing an example of a low duty cycle current input for a laser detection system.

FIGS. 31 and 32 show examples of a high duty cycle current input and a low duty cycle current input, respectively. The high duty cycle current input shown in FIG. 31 provides an example in which the laser light is detected by one or more photodiodes 902 about 10 times every 0.9 milliseconds. The low duty cycle current input shown in FIG. 32 provides an example in which the laser light is detected by one or more photodiodes 902 about 13 times every 1.2 milliseconds. The FIGS. 33 and 34 show graphical representations of exemplary effects on output voltage of high duty cycle current inputs and low duty cycle current inputs, while FIGS. 35 and 36 show graphical representations of exemplary effects on output voltage of high duty cycle current inputs and low duty cycle current inputs different from those shown in FIGS. 33 and 34.

Figure 33:
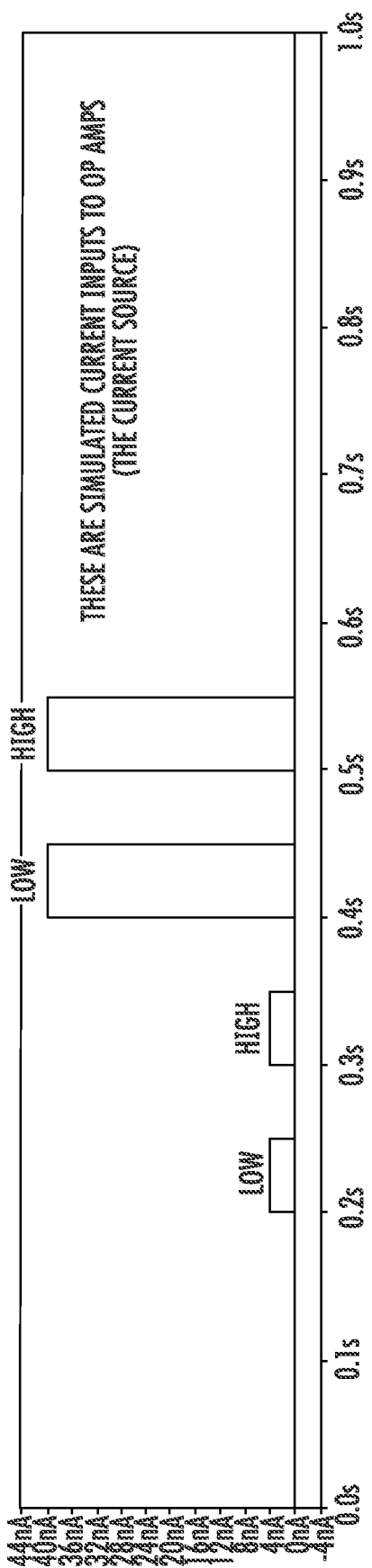
FIG. 33 is a graphical illustration showing the exemplary effects on output current of high duty cycle current inputs and low duty cycle current inputs.
Figure 34:
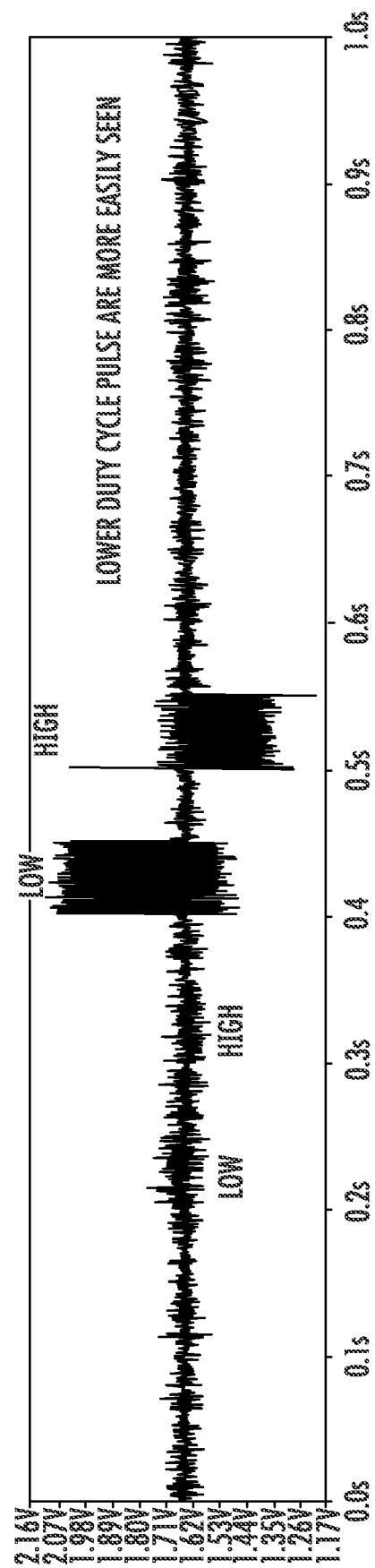
FIG. 34 is a graphical illustration showing the exemplary effects on output voltage of high duty cycle current inputs and low duty cycle current inputs.

In FIGS. 33 and 34, the graphs provide a visual comparison to illustrate an exemplary response to laser pulses operating at a high duty cycle versus laser pulses operating at a low duty cycle. The duty cycle is defined as the ratio of the time the laser pulse response is at a high voltage to the time the laser pulse response is at a low voltage. In FIG. 33, the graph shows a high duty cycle response where the duty cycle is greater than 90 percent. Embodiments of the invention may be operated using laser pulses with a high duty cycle greater than 75 percent. In FIG. 34, the graph shows a low duty cycle response with a duty cycle less than 10 percent. Embodiments of the invention may be operated using laser pulses with a low duty cycle less than 25 percent. In a particular example, both high and low duty cycle pulses are 10-kilohertz pulses.

In FIG. 34, the graph shows four separate pulses. The two on the left are in response to a low-power laser beam, as indicated by the two low-current inputs on the left side of FIG. 33. The two on the right are in response to a high-power laser beam, as indicated by the two high-current inputs on the right side of FIG. 33. One of the two low-current inputs is from a laser pulsing in accordance with a high duty cycle, and the other from a laser pulsing in accordance with a is a low duty cycle. The output voltage shown in FIG. 34 illustrates that the lower duty cycle laser is more easily seen above the 1.65-volt threshold for both the low-power laser beam and the high-power laser beam. In this example, as in the one above, the laser pulses are 10-kilohertz pulses.

Figure 35:
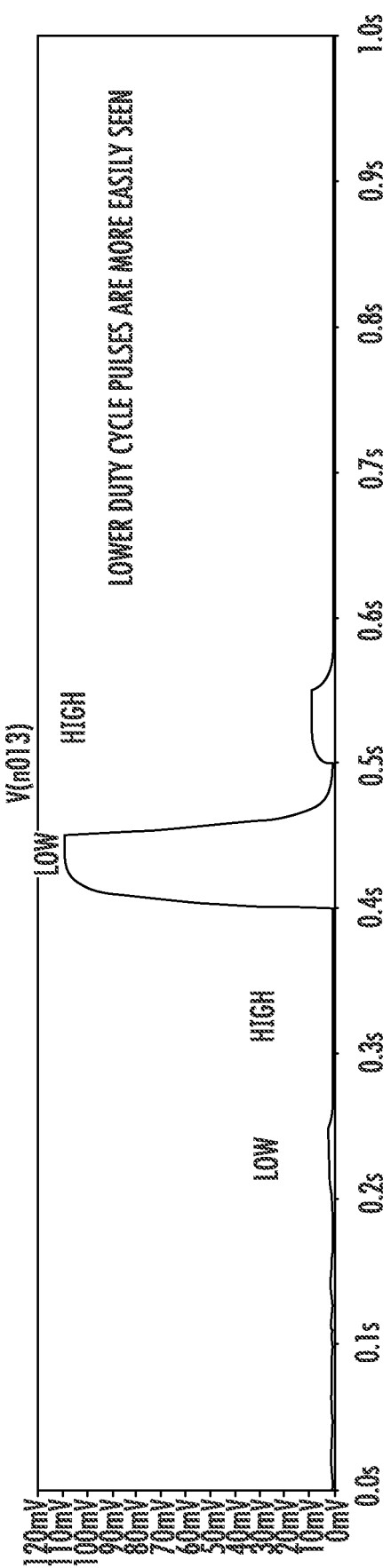
FIG. 35 is a graphical illustration showing the final amplified output from a photodiode or photodiode array as a result of high duty cycle current inputs and low duty cycle current inputs, where the final amplified output is amplified at a first level of gain.
Figure 36:
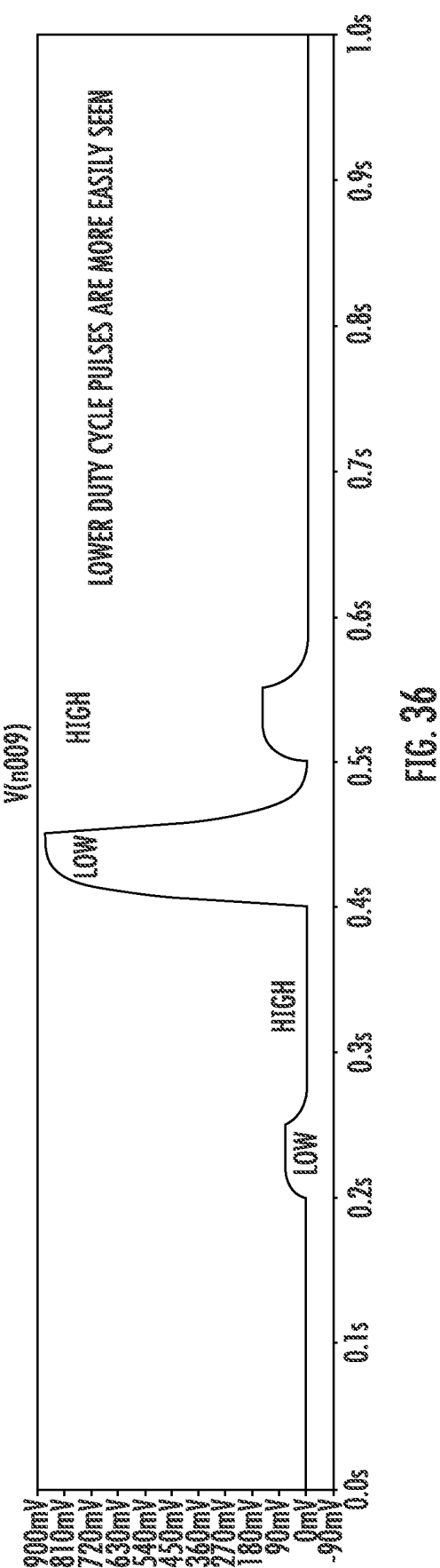
FIG. 36 is a graphical illustration showing the final amplified output from a photodiode or photodiode array as a result of high duty cycle current inputs and low duty cycle current inputs, where the final amplified output is amplified at a second level of gain higher than the first level of gain.

In FIGS. 35 and 36, the graphs show the final amplified output from a photodiode or photodiode array that will be input into a microcontroller. As can be seen, after filtering, the lower duty cycle pulses at both the low-power and high-power laser light intensities are more visible that the higher duty cycle pulses. FIGS. 35 and 36 show the same output signal at different amplification levels. As indicated by the voltages, FIG. 35 is the output generated at a lower level of gain, while FIG. 36 is the output generated at a higher level of gain. In certain embodiments of the invention, the laser level is configured to generate laser light that pulses in accordance with a lower duty cycle modes when aligning the laser. This results in the output having a better signal-to-noise ratio such that less amplification is needed to read the output signal. However, the lower duty cycle results in a less visible laser beam. In some cases, depending on how low the duty cycle is the laser may not be visible to the human eye. In such a case, the lower duty cycle is used only for alignment of the laser beam. Then the duty cycle is increased to a higher level where the laser is more visible.

Figure 37:
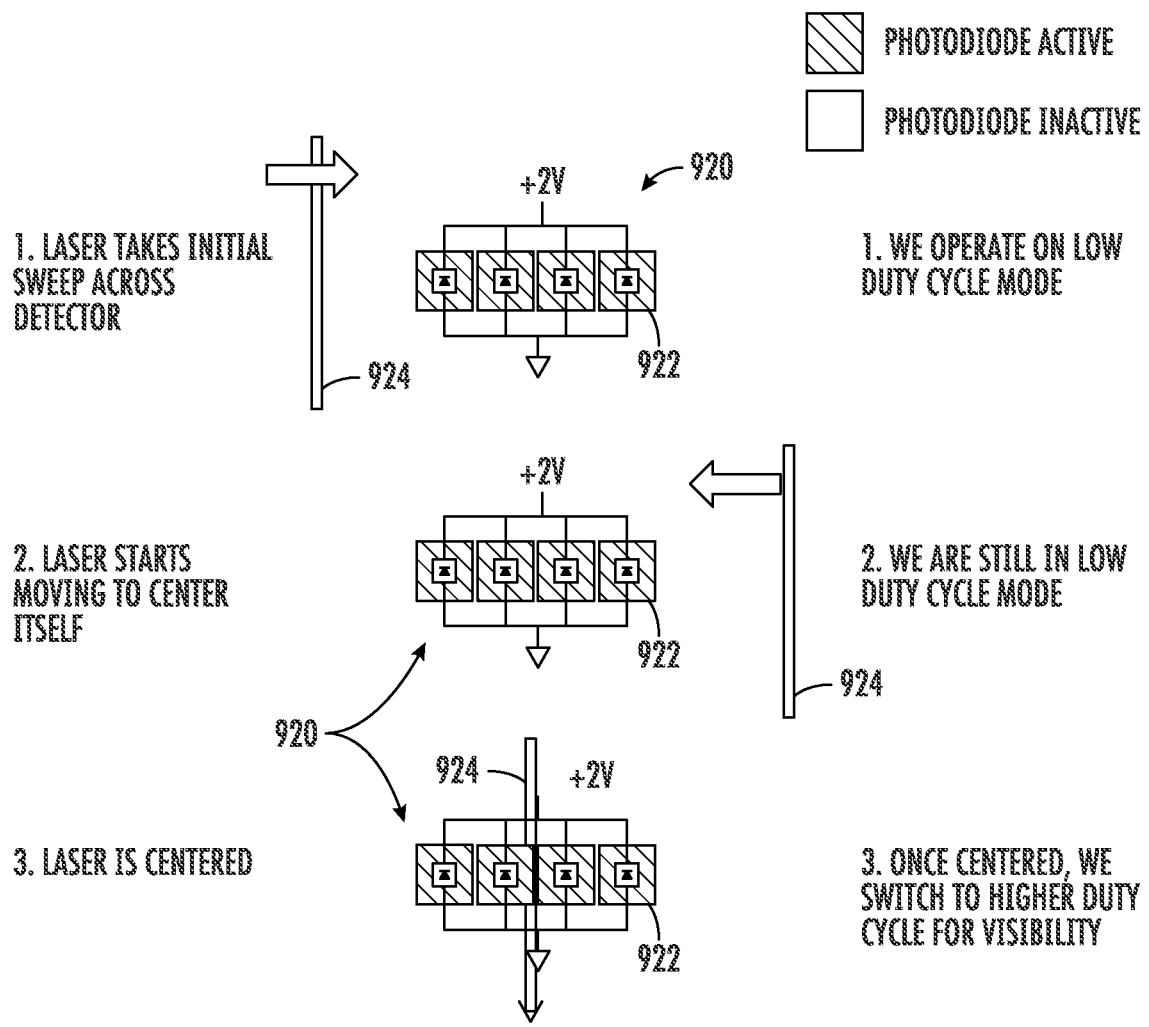
FIG. 37 is a schematic representation of a photodiode array which is used to demonstrate a particular process for the automatic alignment of the laser level, according to an exemplary embodiment.

FIG. 37 is a schematic representation of a photodiode array 920 which is used to demonstrate a particular process for the automatic alignment of the laser level 20 (shown in FIG. 1), according to an exemplary embodiment. In the example shown, the photodiode array 920 includes four photodiodes 922 coupled in parallel, though it is understood that the array 920 could have a number of photodiodes 922 greater or lesser than four. The photodiode array 920 is arranged to receive a laser beam or laser light from the laser level 20. The photodiode array 920 is configured to generate an electrical output in response to the laser light emitted by the laser level 20. The laser light from laser level 20 is swept in a first direction across the photodiode array 920 from one end of the array 920 to beyond the other end. The laser light is pulsing at a rate indicative of a first duty cycle. In this context, the laser light typically pulses periodically between a high point and a low point. The high point represents the full power of the laser light or laser beam, while the low point typically represents zero power or the absence of the laser light.

With the laser light still pulsing at the first duty cycle, the laser is aligned with respect to the photodiode array 920. Alignment involves focusing the laser light on the photodiode array 920 such that a first electrical current generated from a first end of the photodiode array 920 is equal to a second electrical current generated from a second end of the photodiode array 920 opposite the first end. After the laser level 20 is aligned, the laser light is pulsed at a second duty cycle rate. The second duty cycle rate is higher than the first duty cycle rate such that visibility of the laser light is improved.

It should be understood that the figures illustrate the exemplary embodiments in detail, and it should be understood that the present application is not limited to the details or methodology set forth in the description or illustrated in the figures. It should also be understood that the terminology is for description purposes only and should not be regarded as limiting.

Further modifications and alternative embodiments of various aspects of the disclosure will be apparent to those skilled in the art in view of this description. Accordingly, this description is to be construed as illustrative only. The construction and arrangements, shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present disclosure.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more component or element, and is not intended to be construed as meaning only one. As used herein, "rigidly coupled" refers to two components being coupled in a manner such that the components move together in a fixed positional relationship when acted upon by a force.

Various embodiments of the disclosure relate to any combination of any of the features, and any such combination of features may be claimed in this or future applications. Any of the features, elements or components of any of the exemplary embodiments discussed above may be utilized alone or in combination with any of the features, elements or components of any of the other embodiments discussed above.

For purposes of this disclosure, the term "coupled" means the joining of two components directly or indirectly to one another. Such joining may be stationary in nature or movable in nature. Such joining may be achieved with the two members and any additional intermediate members being integrally formed as a single unitary body with one another or with the two members or the two members and any additional member being attached to one another. Such joining may be permanent in nature or alternatively may be removable or releasable in nature.

While the current application recites particular combinations of features in the claims appended hereto, various embodiments of the invention relate to any combination of any of the features described herein whether or not such combination is currently claimed, and any such combination of features may be claimed in this or future applications. Any of the features, elements, or components of any of the exemplary embodiments discussed above may be used alone or in combination with any of the features, elements, or components of any of the other embodiments discussed above.

In various exemplary embodiments, the relative dimensions, including angles, lengths and radii, as shown in the Figures are to scale. Actual measurements of the Figures will disclose relative dimensions, angles and proportions of the various exemplary embodiments. Various exemplary embodiments extend to various ranges around the absolute and relative dimensions, angles and proportions that may be determined from the Figures. Various exemplary embodiments include any combination of one or more relative dimensions or angles that may be determined from the Figures. Further, actual dimensions not expressly set out in this description can be determined by using the ratios of dimensions measured in the Figures in combination with the express dimensions set out in this description.

What is claimed is:

1. A method of operating a laser level light detection system, the method comprising:
    providing a first photodiode array and a second photodiode array wherein each photodiode array includes two or more photodiodes connected in parallel, and arranging the first and second photodiode arrays to receive laser light from a laser level, the first and second photodiode arrays configured to generate an electrical output in response to the laser light;
    amplifying a first output of the first photodiode array, and amplifying a second output of the second photodiode array, wherein amplifying the output of the first and second photodiode array comprises simultaneously providing more than one amplified output for each photodiode array, where each of the more than one amplified outputs for the first photodiode array has a different level of amplification, and each of the more than one amplified outputs for the second photodiode array has a different level of amplification; and
    automatically selecting one first array output from the more than one amplified outputs of the first photodiode array, and providing the selected one first-array output as a system output of the first photodiode array, and selecting one second array output from the more than one amplified outputs of the second photodiode array, and providing the selected one second-array output as a system output of the second photodiode array.

2. The method of claim 1, wherein providing more than one amplified output for each photodiode array comprises simultaneously providing a low-gain amplification output, a medium-gain amplification output, and a high-gain amplification output for each of the first and second photodiode arrays.

3. The method of claim 2, further comprising automatically selecting one output from the low-gain output, medium-gain output, and high-gain amplification output of the first photodiode array, and providing the selected one output as an output of the first photodiode array.

4. The method of claim 3, further comprising automatically selecting one output from the low-gain output, medium-gain output, and high-gain amplification output of the second photodiode array, and providing the selected one output as an output of the second photodiode array.

5. The method of claim 1, further comprising the step of determining a distance between the first photodiode array and a source of laser light.

6. The method of claim 5, wherein determining a distance between the first photodiode array and a source of laser light comprises counting a number of laser beam pulses during a first sweep of a laser beam over the first array of photodiodes.

7. The method of claim 6, further comprising the step of applying a first negative bias voltage to the first photodiode array during counting of laser beam pulses.

8. The method of claim 6, further comprising the step of deactivating some photodiodes in the first photodiode array and applying a second negative bias voltage to the first photodiode array before a second sweep of the laser beam over the first array of photodiodes, the second negative bias voltage being less that the first negative bias voltage.

9. The method of claim 6, further comprising the step of automatically aligning the laser beam during the second sweep by stopping the sweep and focusing the laser beam on that point on the first photodiode array where a first current generated from a first end of the first photodiode array is equal to a second current generated from a second end of the first photodiode array opposite the first end.

10. A method of operating a laser level light detection system, the method comprising:
providing an array of photodiodes coupled in parallel, and arranging the array of photodiodes to receive laser light from a laser level, the photodiode array configured to generate an electrical output in response to the laser light;
maintaining a first reverse bias voltage across the array of photodiodes while a first pulsed laser beam sweeps over each photodiode in the array of photodiodes;
counting a number of laser beam pulses during the sweep of the laser beam over the array of photodiodes, then determining a distance from the array of photodiodes to a source of the pulsed laser beam based on the counted laser beam pulses;
determining a best gain for amplification of an output from the array of photodiodes; and
applying a second reverse bias voltage across the array of photodiodes while a second pulsed laser beam sweeps over each photodiode in the array of photodiodes, the second reverse bias voltage being less than the first reverse bias voltage.

11. The method of claim 10, further comprising deactivating one or more photodiodes in the array of photodiodes.

12. The method of claim 11, wherein the array of photodiodes is arranged linearly such that individual photodiodes are positioned adjacently in a line from a first end of the array to a second end of the array, and wherein deactivating one or more photodiodes in the array of photodiodes comprises deactivating one photodiode at the first end of the array and deactivating one photodiode at the second end of the array.

13. The method of claim 12, wherein deactivating one or more photodiodes in the array of photodiodes comprises deactivating two photodiodes at the first end of the array and deactivating two photodiodes at the second end of the array.

14. The method of claim 11, wherein the array of photodiodes is arranged linearly such that individual photodiodes are positioned adjacently in a line from a first end of the array to a second end of the array, the array of photodiodes configured to provide a first current output from the first end and a second current output from the second end.

15. The method of claim 14, further comprising the step of transmitting a signal that indicates when the first current output is above a threshold current and equal to the second current output, thus indicating laser alignment.

16. The method of claim 15, further comprising the step of activating the deactivated one or more photodiodes after laser alignment.

17. The method of claim 15, wherein the first current output is from one half of the photodiodes in the array of photodiodes, and the second current output is from the remaining half of the photodiodes in the array of photodiodes.

18. The method of claim 10, wherein maintaining the first reverse bias voltage across the array of photodiodes comprises maintaining the first reverse bias voltage of at least two volts.

19. The method of claim 10, wherein maintaining the first reverse bias voltage across the array of photodiodes comprises maintaining the first reverse bias voltage of at least 18 volts.

20. The method of claim 10, wherein applying the second reverse bias voltage across the array of photodiodes comprises applying the second reverse bias voltage of less than three tenths of a volt.

21. The method of claim 10, wherein applying the second reverse bias voltage across the array of photodiodes comprises applying the second reverse bias voltage of less than two volts.

22. A method of operating a laser level light detection system, the method comprising:
arranging a photodiode array to receive laser light from a laser level, the photodiode array configured to generate an electrical output in response to the laser light
sweeping a laser beam across the photodiode array, the laser light pulsing at a first duty cycle rate;
aligning the laser beam on the photodiode array such that a first current generated from a first end of the photodiode array is equal to a second current generated from a second end of the photodiode array opposite the first end; and
causing the laser light to pulse at a second duty cycle rate, the second duty cycle rate being higher than the first duty cycle rate.

23. The method of claim 22, wherein pulsing the laser light at a first duty cycle rate comprises pulsing the laser light at a duty cycle of less than 25 percent.

24. The method of claim 22, wherein pulsing the laser light at a first duty cycle rate comprises pulsing the laser light at a duty cycle of less than 10 percent.

25. The method of claim 22, wherein causing the laser light to pulse at a second duty cycle rate comprises causing the laser light to pulse at a duty cycle greater than 75 percent.

26. The method of claim 22, wherein causing the laser light to pulse at a second duty cycle rate comprises causing the laser light to pulse at a duty cycle greater than 90 percent.

* * * * *